US010826195B2

(12) United States Patent
Madsen et al.

(10) Patent No.: US 10,826,195 B2
(45) Date of Patent: Nov. 3, 2020

(54) APPARATUS AND METHOD FOR RF ISOLATION IN A PACKAGED INTEGRATED CIRCUIT

(71) Applicant: Anokiwave, Inc., San Diego, CA (US)

(72) Inventors: Kristian N. Madsen, Napa, CA (US); Vipul Jain, Irvine, CA (US); Amir Esmaili, San Diego, CA (US); Chad Cookinham, San Diego, CA (US); Noyan Kinayman, Harvard, MA (US); Shamsun Nahar, San Diego, CA (US); David W. Corman, Gilbert, AZ (US); Nitin Jain, San Diego, CA (US)

(73) Assignee: ANOKIWAVE, INC., San Diego, CA (US)

(*) Notice: Subject to any disclaimer, the term of this patent is extended or adjusted under 35 U.S.C. 154(b) by 150 days.

(21) Appl. No.: 15/938,647

(22) Filed: Mar. 28, 2018

(65) Prior Publication Data

US 2018/0287266 A1 Oct. 4, 2018

Related U.S. Application Data

(60) Provisional application No. 62/479,823, filed on Mar. 31, 2017.

(51) Int. Cl.
  *H01Q 21/00* (2006.01)
  *H01Q 3/36* (2006.01)
  (Continued)

(52) U.S. Cl.
  CPC ......... *H01Q 21/065* (2013.01); *H01Q 1/2283* (2013.01); *H01Q 3/36* (2013.01)

(58) Field of Classification Search
  CPC ........ H01Q 1/2283; H01Q 1/52; H01Q 1/521; H01Q 1/523; H01Q 1/525; H01Q 1/528;
  (Continued)

(56) References Cited

U.S. PATENT DOCUMENTS 6,380,823 B1 * 4/2002 Ikata .................. H03H 9/72
                                                   333/133
7,518,221 B2 * 4/2009 Gaucher ................ H01L 23/66
                                                   257/672

(Continued)

FOREIGN PATENT DOCUMENTS

WO    2017019244 A1    2/2017
WO    2017040172 A1    3/2017

OTHER PUBLICATIONS

Bailey, Michael—"General Layout Guidelines for RF and Mixed-Signal PCBs", Maxim Integrated, Tutorial 5100, 10 pages, Sep. 14, 2011.

(Continued)

*Primary Examiner* — Daniel Munoz
*Assistant Examiner* — Patrick R Holecek
(74) *Attorney, Agent, or Firm* — Nutter McClennen & Fish LLP

(57) ABSTRACT

Illustrative embodiments significantly improve RF isolation in a packaged integrated circuit by separating the pins/pads associated with multiple RF channels from one another and also from pins/pads associated with digital circuits. Specifically, in certain exemplary embodiments, the integrated circuit is configured with the pins/pad for the digital circuits on a first edge of the chip, the pins/pads for common RF signals on a second edge of the chip opposite the first edge, and the pins/pads for the individual RF channels on third and fourth edges of the chip. The pins/pads associated with each RF channel may include multiple pins/pads (an "RF group") and may have a central RF pin/pad with a ground pin/pad on each side of the central RF pin/pad. One or more ground pins/pads may be placed between adjacent RF groups on a given edge of the chip.

33 Claims, 16 Drawing Sheets

(51) Int. Cl.
  *H01Q 1/22* (2006.01)
  *H01Q 21/06* (2006.01)
(58) Field of Classification Search
  CPC ............ H01Q 3/36; H01Q 21/0006–30; H01L 23/495; H01L 23/49503; H01L 2223/6677
  See application file for complete search history.

(56) References Cited

U.S. PATENT DOCUMENTS

| | | | |
|---|---|---|---|
| 8,242,586 B2 | 8/2012 | Chang et al. | |
| 8,338,936 B2* | 12/2012 | Pressel | B81B 7/02 257/691 |
| 9,048,284 B2* | 6/2015 | McPartlin | H01L 29/737 |
| 9,721,920 B2* | 8/2017 | Beer | H01L 24/97 |
| 10,276,521 B2* | 4/2019 | Babcock | F21V 23/006 |
| 10,439,284 B2* | 10/2019 | Wang | H01Q 3/34 |
| 2016/0306034 A1* | 10/2016 | Trotta | H01Q 9/0407 |
| 2017/0085006 A1 | 3/2017 | Corman et al. | |

OTHER PUBLICATIONS

International Searching Authority—International Search Report and Written Opinion for International Application No. PCT/US2018/024849, dated Jul. 15, 2018, 13 pages.

Ismail, Mohammed—"Introduction to RF CMOS IC Design for Wireless Applications", Analog VLSI Lab, The Ohio State University, 117 pages, undated.

Jain, Suyash—"Layout Review Techniques for Low Power RF Designs", Application Note AN098, Texas Instruments, 14 pages, 2012.

Linke, Bernhard—"Understanding Flip-Chip and Chip-Scale Package Technologies and Their Applications", Maxim Intergrated, AN4002, 8 pages, Apr. 18, 2007.

Maxim—"5GHz, 4-Channel MIMO Transmitter", MAX2850, Maxim Integrated Products, Inc., 33 pages, 2010.

Silicon Labs—"Layout Design Guide for the Si4455/435x RF ICs", AN685, Silicon Laboratories, 22 pages, 2014.

\* cited by examiner

APPARATUS AND METHOD FOR RF ISOLATION IN A PACKAGED INTEGRATED CIRCUIT

CROSS-REFERENCE TO RELATED APPLICATION(S)

This patent application claims the benefit of U.S. Provisional Patent Application No. 62/479,823 entitled APPARATUS AND METHOD FOR RF ISOLATION IN A PACKAGED INTEGRATED CIRCUIT filed Mar. 31, 2017, which is hereby incorporated herein by reference in its entirety.

The subject matter of this patent application may be related to the subject matter of U.S. Pat. No. 9,455,157 issued Sep. 27, 2016 and entitled METHOD AND APPARATUS FOR MITIGATING PARASITIC COUPLING IN A PACKAGED INTEGRATED CIRCUIT, which is hereby incorporated herein by reference in its entirety.

The subject matter of this patent application also may be related to the subject matter of U.S. patent application Ser. No. 15/267,689 entitled LAMINAR PHASED ARRAY ANTENNA filed Sep. 16, 2016, which is hereby incorporated herein by reference in its entirety.

The subject matter of this patent application also may be related to the subject matter of U.S. patent application Ser. No. 15/267,704 entitled LAMINAR PHASED ARRAY WITH POLARIZATION-ISOLATED TRANSMIT/RECEIVE INTERFACES filed Sep. 16, 2016, which is hereby incorporated herein by reference in its entirety.

FIELD OF THE INVENTION

The invention generally relates to phased arrays and, more particularly, the invention relates to a phased array component packaging. More specifically the packaging of Integrated Circuits (ICs) used to build phased arrays.

BACKGROUND OF THE INVENTION

Integrated circuit die typically are mounted within an integrated circuit package. Among other functions, integrated circuit packages can both protect the die from the environment and facilitate mounting to an underlying system, such as a printed circuit board, module, or other integrated circuit.

Those in the art have developed many different types of packages for a wide variety of applications. One of the more commonly used types of packages is known as a "leadframe" package. Specifically, a leadframe package often has a metallic leadframe (e.g., formed from copper) for electrically connecting the die/integrated circuit to the external environment, and an encapsulant, such as injection molding material or plastic, encapsulating much of the leadframe and the die. Quite often, the encapsulant and leadframe form a rectangularly shaped body for readily securing to an underlying system.

The leadframe often has two primary parts; namely, a die paddle for supporting the integrated circuit die, and a plurality of leads for electrically connecting the die with the underlying system. To those ends, a die attach material often physically secures the die to the die paddle, while a wirebond or other interconnect electrically connects the die to the leads. In fact, the interior of a packaged integrated circuit often has dozens or hundreds of wirebonds that connect the die to the leads.

Active electronically steered antenna systems ("AESA systems," a type of "phased array system" also referred as "Active Antenna") form electronically steerable beams for a wide variety of radar and communications systems. To that end, AESA systems typically have a plurality of beam forming elements (e.g., antennas) that apply and/or receive energy so that each beam forming element can be coherently (i.e., in-phase and amplitude) combined (referred to herein as "beam forming" or "beam steering"). Specifically, many AESA systems implement beam steering by providing a unique RF phase shift and gain setting (phase and gain together constitute a complex beam weight) between each beam forming element and a beamforming or summation point. The RF phase shifting and amplitude adjustment is commonly performed using an integrated circuit (IC), which may contain the RF circuitry to support one or more beam forming elements (e.g. 1, 2, 3, 4, 6, 8, 12, 16, etc.). The IC is often packaged using the methods described above.

SUMMARY OF VARIOUS EMBODIMENTS

In accordance with one embodiment of the invention, an integrated circuit includes a top; a bottom; four edges including distinct first, second, third, and fourth edges, wherein the second edge is opposite the first edge; a set of digital circuitry pads on the first edge; a set of common RF pads on the second edge opposite the first edge; and at least one set of RF pads on each of the third and fourth edges, each set of RF pads associated with a distinct RF channel.

In various alternative embodiments, the at least one set of RF pads on each of the third and fourth edges may include at least two sets of RF pads on each of the third and fourth edges. The set of common RF pads and each set of RF pads may include a central RF pad and a pair of ground pads positioned on opposing sides of the central RF pad. The integrated circuit may include at least one ground pad between two sets of RF pads on each of the third and fourth edges. The integrated circuit may include a ground connection providing an electrical connection from the ground of the integrated circuit to at least one ground pad of an RF group. The integrated circuit may include SiGe BiCMOS components. Each RF channel may be configured with both transmit and receive circuitry. The embodiment may further have a leadframe or may be flip chip.

In accordance with another embodiment of the invention, a packaged integrated circuit comprises an integrated circuit of the types summarized above, and further comprises a leadframe including a set of digital circuitry leads corresponding to the set of digital circuitry pads, a set of common RF leads corresponding to the set of common RF pads, a set of RF leads corresponding to each set of RF pads, and electrical conductors connecting each of said pads of the integrated circuit with a corresponding lead of the leadframe.

In various alternative embodiments, the leadframe may include a die paddle representing a ground plane, and the integrated circuit may include a ground via providing an electrical connection from the bottom of the integrated circuit between at least one ground pad of an RF group and the die paddle. At least one pad of the integrated circuit may be connected to a corresponding lead of the leadframe using two or more electrical conductors. The leadframe may be between about 5 mm to 7 mm square.

In accordance with another embodiment of the invention, an active electronically steered antenna system comprises a circuit board, a plurality of patch antennas on the circuit board, a plurality of packaged integrated circuits of the types summarized above on the circuit board, and a leadframe of the types summarized above having electrical conductors connecting each of said pads of the integrated circuit with a corresponding lead of the leadframe, wherein each patch antenna is electrically connected to a distinct RF channel of a packaged integrated circuit.

In various alternative embodiments, the integrated circuits may be on a same side of the printed circuit board as the patch antennas or may be on a different side of the printed circuit board than the patch antennas, in which case the printed circuit board may include conductive vias configured to make electrical connections between the integrated circuits and the patch antennas. Such electrical connections may include impedance controlled lines and transitions.

In accordance with another embodiment of the invention, a method of forming a packaged integrated circuit comprises providing an integrated circuit of the types summarized above; providing a leadframe of the types summarized above; electrically connecting each of said pads of the integrated circuit with a corresponding lead of the leadframe; and encapsulating the integrated circuit and at least part of the leadframe.

In various alternative embodiments, the leadframe may include a die paddle, and the method may further involve securing the integrated circuit to the die paddle. The integrated circuit may include a via extending from the bottom, in which case securing the integrated circuit to the die paddle may involve electrically connecting the via with the die paddle. Electrically connecting each of said pads of the integrated circuit with a corresponding lead of the leadframe may involve connecting at least one wirebond between each of said pads of the integrated circuit and the corresponding lead of the leadframe.

Additional embodiments may be disclosed and claimed.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

It should be noted that the foregoing figures and the elements depicted therein are not necessarily drawn to consistent scale or to any scale. Unless the context otherwise suggests, like elements are indicated by like numerals.

DESCRIPTION OF ILLUSTRATIVE EMBODIMENTS

Figure 1:
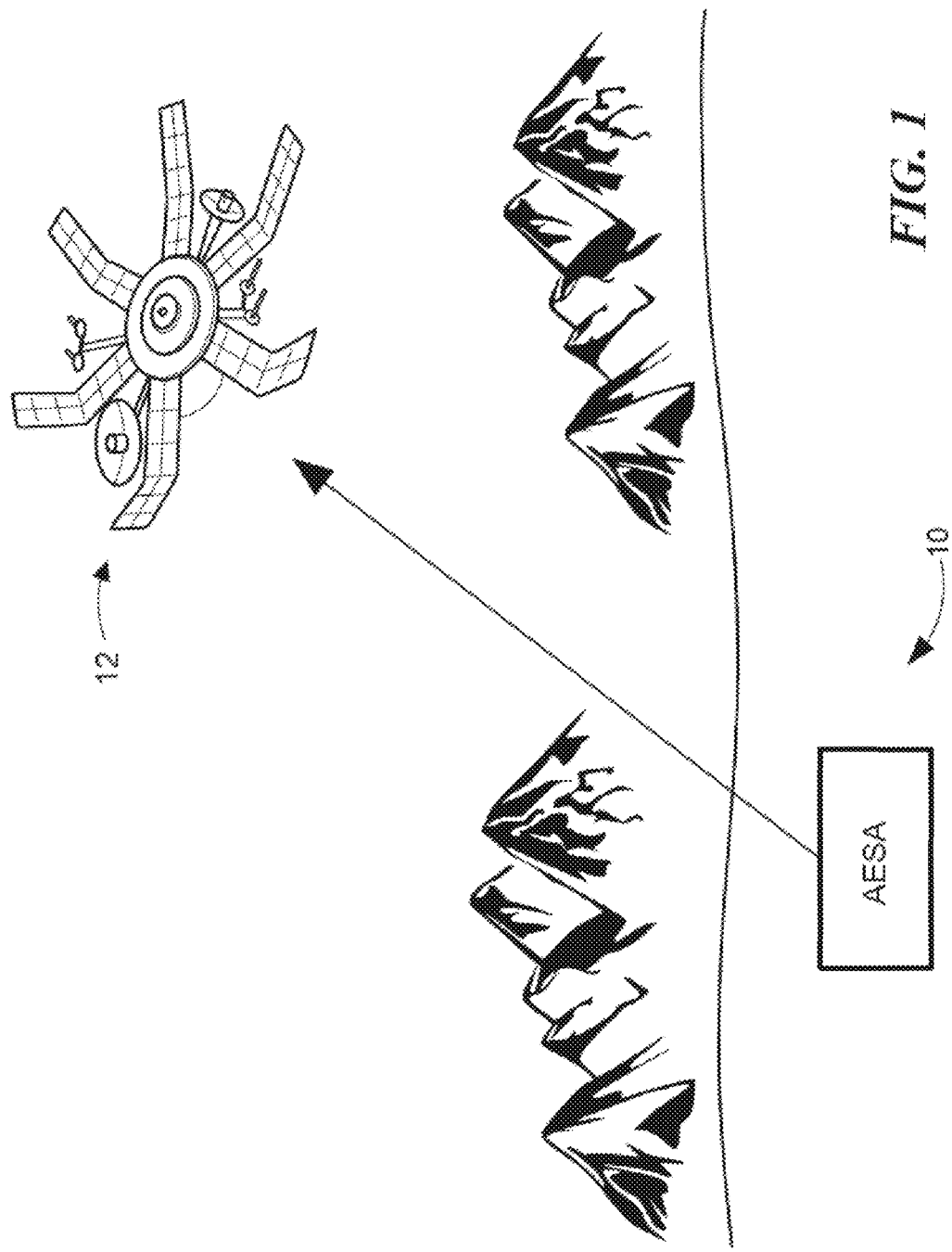
FIG. 1 schematically shows an active electronically steered antenna system ("AESA system") configured in accordance with certain illustrative embodiments of the invention and communicating with an orbiting satellite.

Definitions. As used in this description and the accompanying claims, the following terms shall have the meanings indicated, unless the context otherwise requires:

A "set" includes one or more members.

A "beam forming element" (sometimes referred to simply as an "element" or "radiating element") is an element that is used to generate a signal for beam forming and/or to receive a signal for beam forming. Different types of beam forming elements can be used for different beam forming applications. For example, the beam forming elements may be RF antennas for RF applications (e.g., radar, cellular networks such as 5G applications, satellite communications, etc.), ultrasonic transducers for ultrasound applications, optical transducers for optical applications, microphones and/or speakers for audio applications, etc. Typically, a beam forming signal provided to or from each beam forming element is independently adjustable, e.g., as to gain/amplitude and phase.

A "beam-formed signal" is a signal produced by or from a plurality of beam forming elements. In the context of the present invention, there is no requirement that a beam-formed signal have any particular characteristics such as directionality or coherency.

A "phased array system" is a system that includes a plurality of beam forming elements and related control logic for producing and processing beam-formed signals.

For convenience, the term "beam forming" is sometimes abbreviated herein as "BF."

Illustrative embodiments significantly improve RF isolation in a packaged integrated circuit by separating the pins/pads associated with multiple RF channels from one another and also from pins/pads associated with digital circuits. Specifically, in certain exemplary embodiments, the integrated circuit is configured with the pins/pad for the digital circuits on a first edge of the chip (referred to herein as the "North" edge), the pins/pads for common RF signals on a second edge of the chip opposite the first edge (referred to herein as the "South" edge), and the pins/pads for the individual RF channels on third and fourth edges of the chip (referred to herein as the "East" and "West" edges). The pins/pads associated with each RF channel may include multiple pins/pads (referred to herein as an "RF group") and may have a central RF pin/pad with a ground pin/pad on each side of the central RF pin/pad. These ground pins/pads help to provide additional isolation. One or more ground pins/pads may be placed between adjacent RF groups on a given edge of the chip. Generally speaking, exemplary embodiments do not include any digital signals or common signals between two adjacent RF channels on a given edge of the chip, although alternative embodiments may include such signals between adjacent RF channels (e.g., pins that are seldom used or do not carry high-frequency signals). The pins/pads for the digital circuits may or may not be fast and/or fast changing in time domain signals.

Although it may be used with other systems, various embodiments are customized for use with active electronically steered antenna (AESA) systems also called Active Antenna. AESA systems form electronically steerable beams that can be used for a wide variety of applications. Although certain details of various embodiments of an AESA system are discussed below, those skilled in the art can apply some embodiments to other AESA systems. Accordingly, discussion of an AESA system does not necessarily limit certain other embodiments.

Active Electronically Steered System Example

FIG. 1 schematically shows an active electronically steered antenna system ("AESA system 10") configured in accordance with certain illustrative embodiments of the invention and communicating with an orbiting satellite 12. A phased array (discussed below and identified by reference number "10A" as in FIG. 6) implements the primary functionality of the AESA system 10. Specifically, as known by those skilled in the art, the phased array 10A forms one or more of a plurality of electronically steerable beams that can be used for a wide variety of applications. As a satellite communication system, for example, the AESA system 10, preferably is configured operate at one or more satellite frequencies. Among others, those frequencies may include the Ka-band, Ku-band, and/or X-band. Of course, as satellite communication technology progresses, future implementations may modify the frequency bands of the integrated circuits 14 to communicate using new satellite frequencies.

Figure 2:
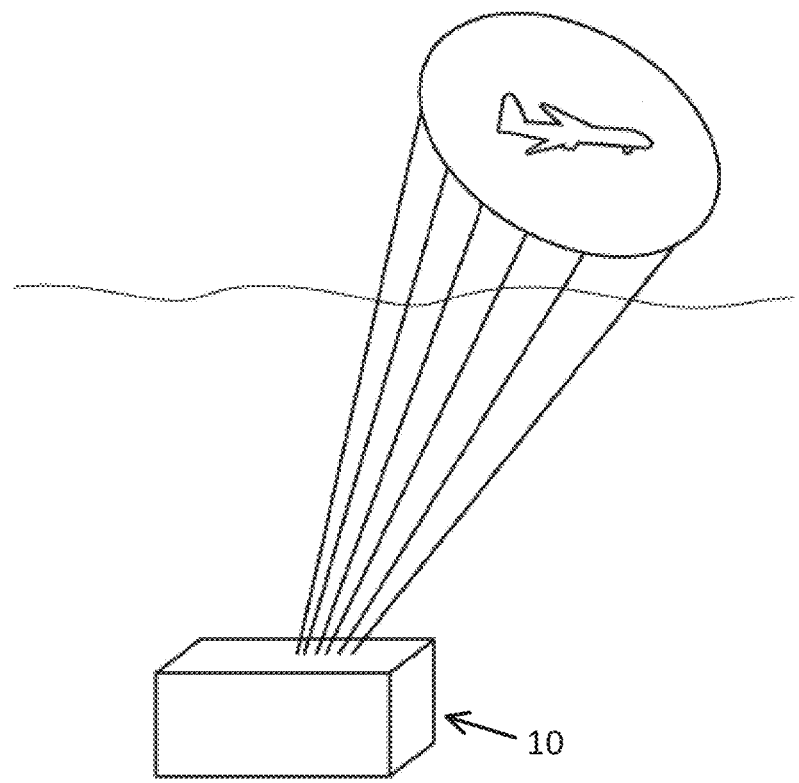
FIG. 2 schematically shows an AESA system configured in accordance with certain illustrative embodiments of the invention and implemented as a radar system in which a beam-formed signal may be directed toward an aircraft or other object in the sky (e.g., to detect or track position of the object).

FIG. 2 schematically shows an AESA system 10 configured in accordance with certain illustrative embodiments of the invention and implemented as a radar system in which a beam-formed signal may be directed toward an aircraft or other object in the sky (e.g., to detect or track position of the object).

Figure 3:
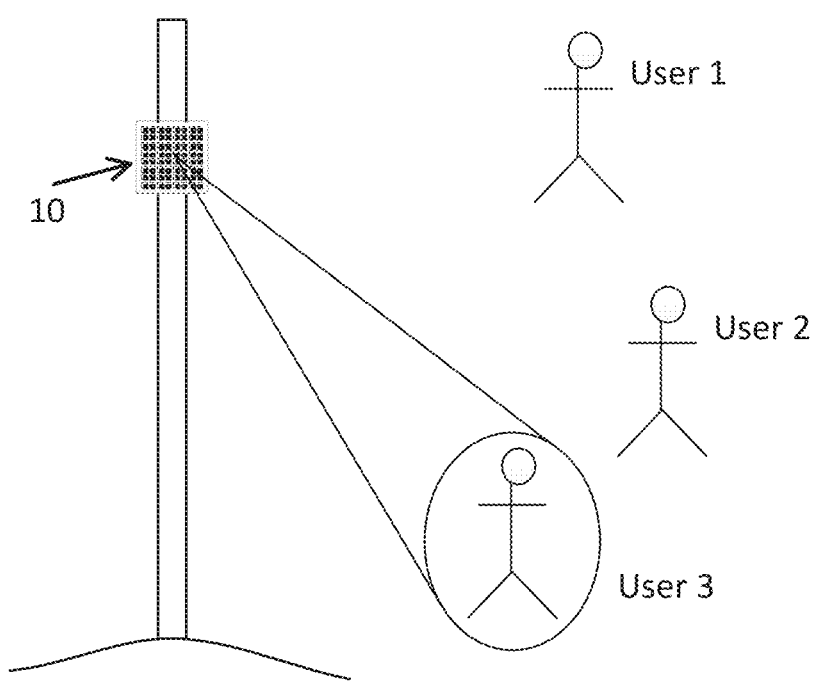
FIG. 3 schematically shows an AESA system 10 configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells).

FIG. 3 schematically shows an AESA system 10 configured in accordance with certain illustrative embodiments of the invention and implemented as a wireless communication system (e.g., 5G) in which a beam-formed signal may be directed toward a particular user (e.g., to increase the effective transmit range of the AESA system or to allow for greater frequency reuse across adjacent or nearby cells). Of course, other implementations may include other types of wireless communication systems.

Of course, those skilled in the art use AESA systems 10 and other phased array systems in a wide variety of other applications, such as RF communication, optics, sonar, ultrasound, etc. Accordingly, discussion of satellite, radar, and wireless communication systems are not intended to limit all embodiments of the invention.

The satellite communication system may be part of a cellular network operating under a known cellular protocol, such as the 3G, 4G (e.g., LTE), or 5G protocols. Accordingly, in addition to communicating with satellites, the system may communicate with earth-bound devices, such as smartphones or other mobile devices, using any of the 3G, 4G, or 5G protocols. As another example, the satellite communication system may transmit/receive information between aircraft and air traffic control systems. Of course, those skilled in the art may use the AESA system 10 (implementing the noted phased array 10A) in a wide variety of other applications, such as broadcasting, optics, radar, etc. Some embodiments may be configured for non-satellite communications and instead communicate with other devices, such as smartphones (e.g., using 4G or 5G protocols). Accordingly, discussion of communication with orbiting satellites 12 is not intended to limit all embodiments of the invention.

Figure 4:
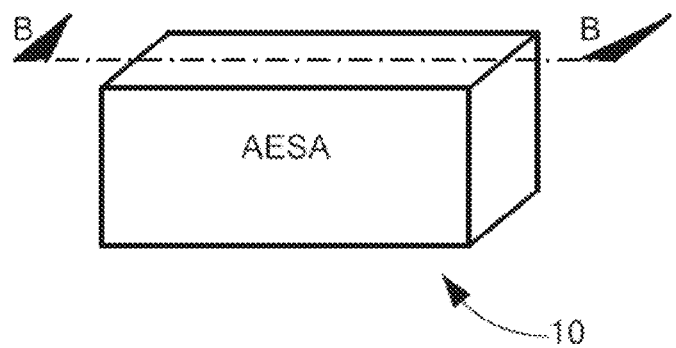
FIGS. 4 and 5 schematically show generalized diagrams of the AESA system configured in accordance with illustrative embodiments of the invention.
Figure 5:
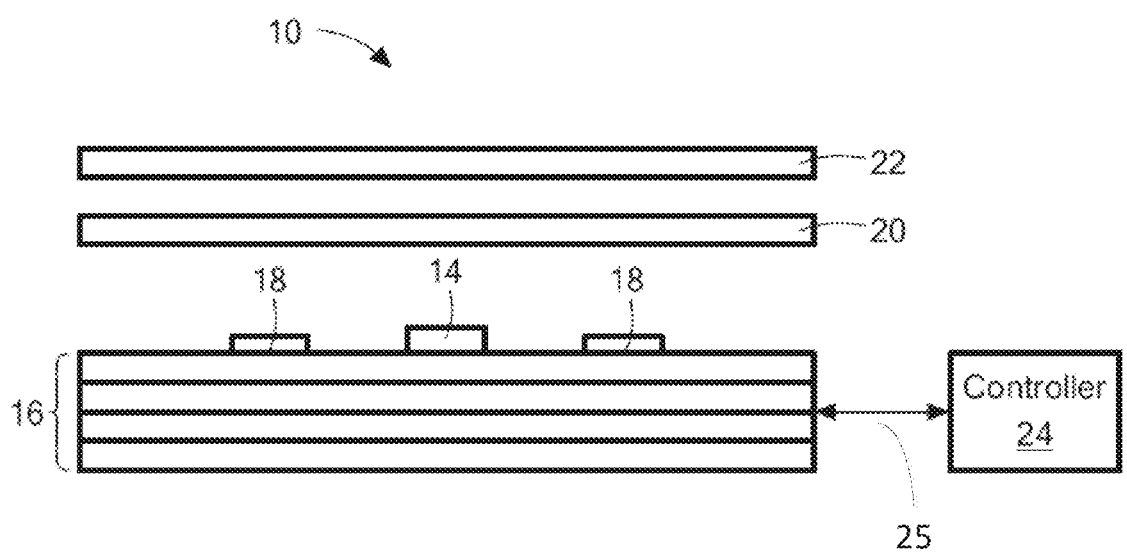

FIGS. 4 and 5 schematically show generalized diagrams of the AESA system 10 configured in accordance with illustrative embodiments of the invention. Specifically, FIG. 4 schematically shows a block diagram of the AESA system 10, while FIG. 5 schematically shows a cross-sectional view of a small portion of the same AESA system 10 across line B-B. This latter view shows a single integrated circuit 14 mounted onto a substrate 16 between two transmit and/or receive elements 18, i.e., on the same side of a supporting substrate 16 and juxtaposed with the two elements 18. The integrated circuit 14 is connected to the elements 18 (connections not shown in this view) for providing signals (e.g., RF signals) to the elements 18 and/or receiving signals (e.g., RF signals) from the elements 18. In alternative embodiments, however, the integrated circuit 14 could be on the other side/surface of the substrate 16, e.g., with through-printed circuit board vias (TPVs) carrying signals between the integrated circuit 14 and the elements 18. The AESA system 10 may also have a polarizer 20 to selectively filter signals to and from the AESA system 10, and may also have a radome 22 to environmentally protect the AESA system 10. A separate antenna controller 24 (FIG. 5) electrically connects with the AESA system 10 to calculate beam steering vectors for the overall AESA system 10, and to provide other control functions. The AESA system 10 typically includes multiple integrated circuits 14, with each integrated circuit 14 connected to multiple elements 18 (e.g., 2, 3, or 4 elements 18). The antenna controller 24 may provide a common signal 25 (e.g., an RF signal) to the integrated circuits 14 and/or may receive a common signal 25 (e.g., an RF signal) from the integrated circuits 14.

Figure 6:
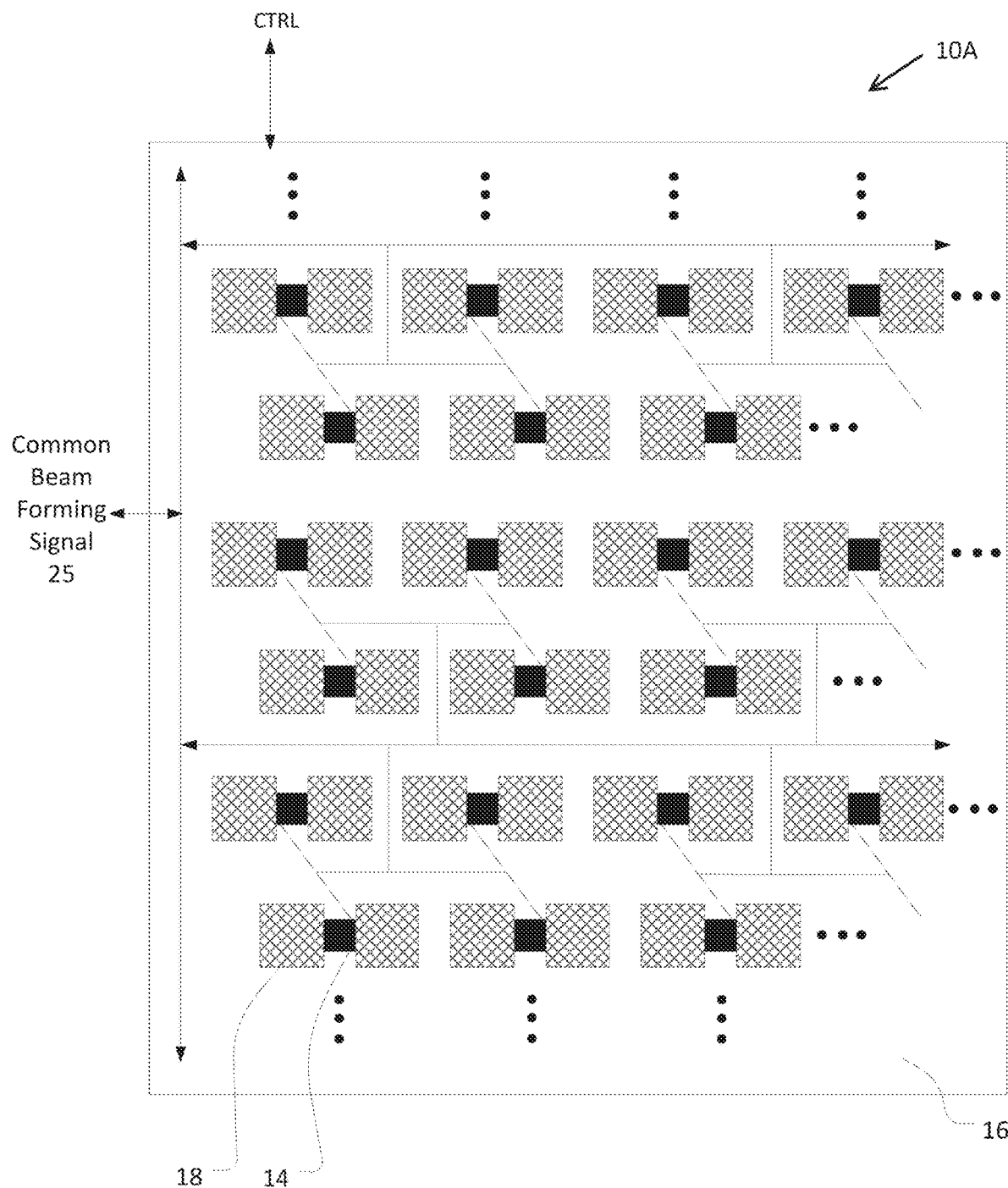
FIG. 6 schematically shows a plan view of a primary portion of an AESA system in which each integrated circuit is connected to two elements, in accordance with illustrative embodiments of the invention.
Figure 7:
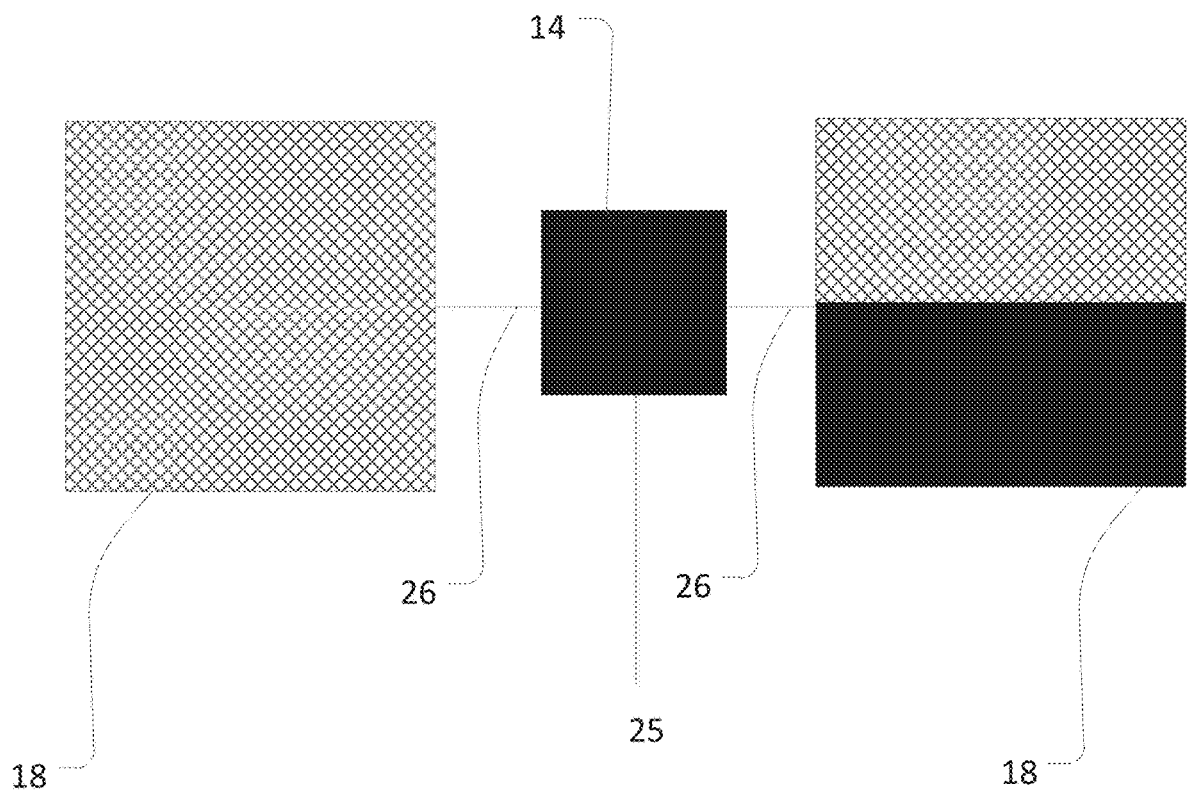
FIG. 7 schematically shows a close-up of a portion of the phased array of FIG. 6.

FIG. 6 schematically shows a plan view of a primary portion of an AESA system 10 in which each integrated circuit 14 is connected to two elements 18, in accordance with illustrative embodiments of the invention. FIG. 7 schematically shows a close-up of a portion of the phased array 10A of FIG. 6.

Figure 8:
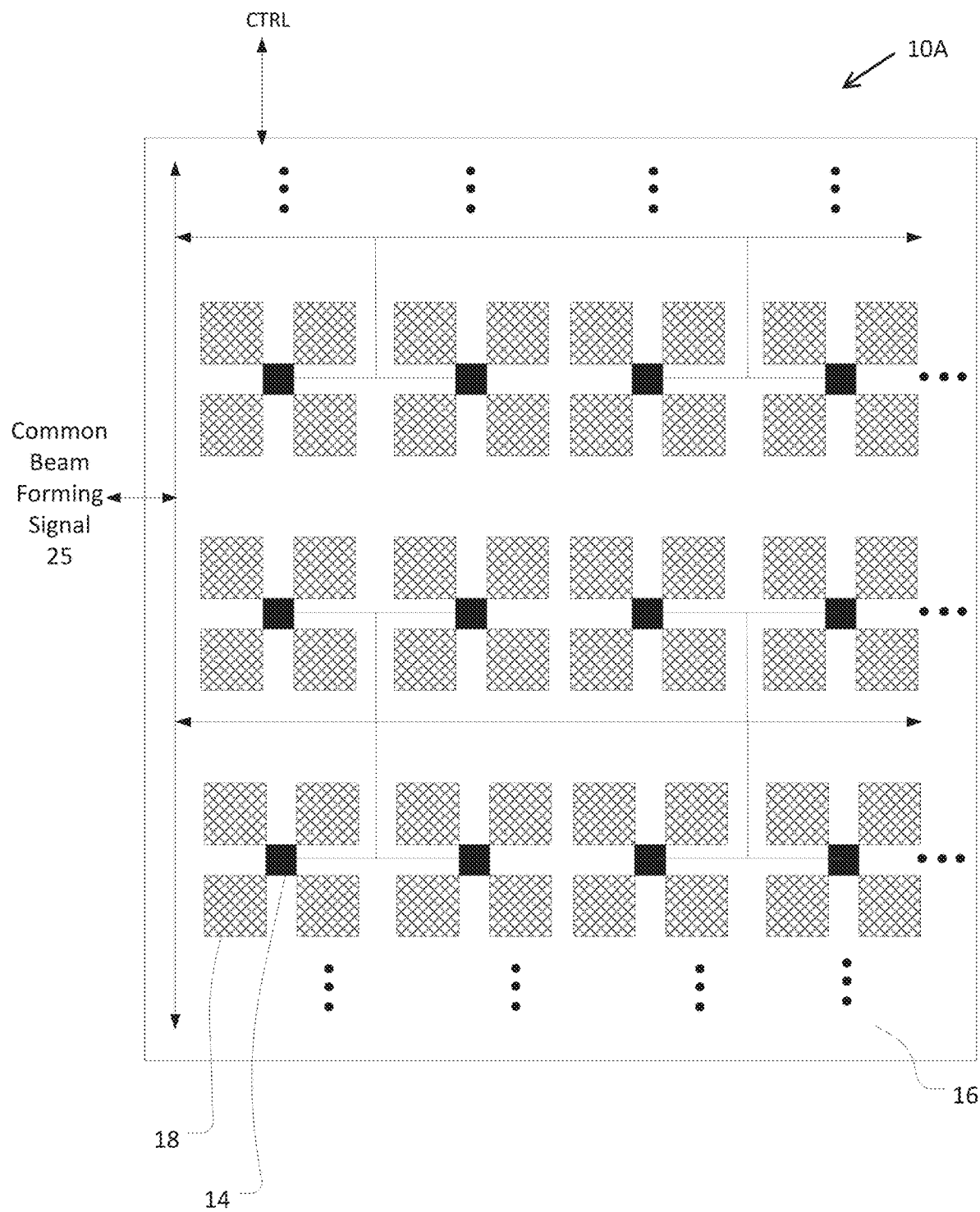
FIG. 8 schematically shows a plan view of a primary portion of an AESA system in which each integrated circuit is connected to four elements, in accordance with illustrative embodiments of the invention.
Figure 9:
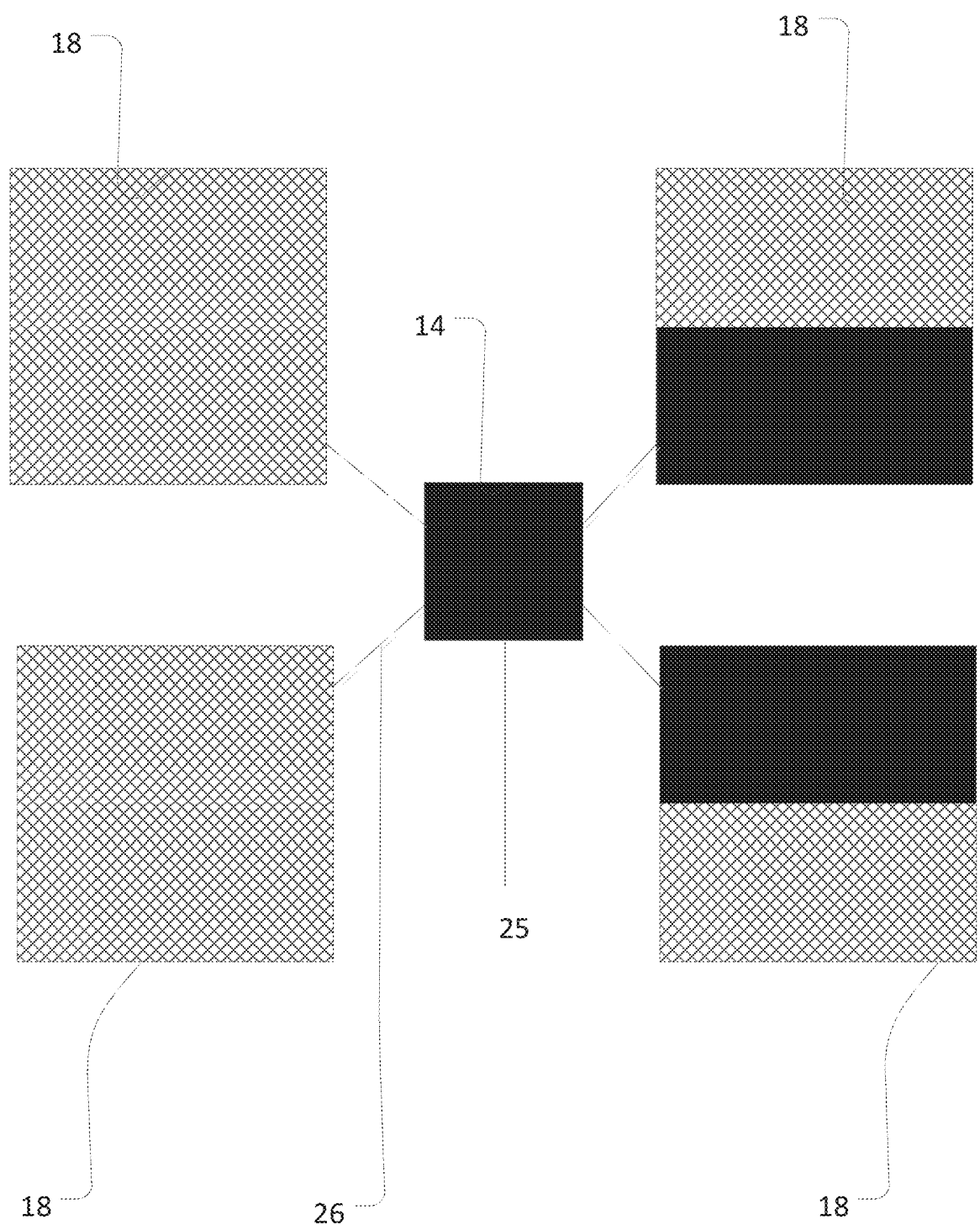
FIG. 9 schematically shows a close-up of a portion of the phased array of FIG. 8.

Similarly, FIG. 8 schematically shows a plan view of a primary portion of an AESA system 10 in which each integrated circuit 14 is connected to four elements 18, in accordance with illustrative embodiments of the invention. FIG. 9 schematically shows a close-up of a portion of the phased array 10A of FIG. 8.

Specifically, the AESA systems 10 of FIGS. 6 and 8 are implemented as a laminar phased array 10A having a laminated printed circuit board 16 (i.e., acting as the substrate and also identified by reference number "16") supporting the above noted plurality of elements 18 and integrated circuits 14. The elements 18 preferably are formed as a plurality of square or rectangular patch antennas oriented in a patch array configuration. It should be noted that other embodiments may use other patch configurations, such as a triangular configuration in which each integrated circuit is connected to three elements 18, a pentagonal configuration in which each integrated circuit is connected to five elements 18, or a hexagonal configuration in which each integrated circuit is connected to six elements 18. Like other similar phased arrays, the printed circuit board 16 also may have a ground plane (not shown) that electrically and magnetically cooperates with the elements 18 to facilitate operation. As mention earlier, FIGS. 6-9 show the integrated circuits 14 on the same side of the printed circuit board as the patch antennas. However, in alternative embodiments, the integrated circuits 14 may be on the other side of the printed circuit board 16, e.g., with through-PCB vias (TPVs) and traces that connect to the elements 18. Such connections are made using impedance controlled lines and transitions.

Indeed, the arrays shown in FIGS. 6 and 8 are small phased arrays 10A. Those skilled in the art can apply principles of illustrative embodiments to laminar phased arrays 10A with hundreds, or even thousands, of elements 18 and integrated circuits 14 (e.g., 256 elements with 64 or 128 integrated circuits). In a similar manner, those skilled in the art can apply various embodiments to smaller phased arrays 10A.

As a patch array, the elements 18 have a low profile. Specifically, as known by those skilled in the art, a patch antenna (i.e., the element 18) typically is mounted on a flat surface and includes a flat rectangular sheet of metal (known as the patch and noted above) mounted over a larger sheet of metal known as a "ground plane." A dielectric layer between the two metal regions electrically isolates the two sheets to prevent direct conduction. When energized, the patch and ground plane together produce a radiating electric field. Illustrative embodiments may form the patch antennas using conventional semiconductor fabrication processes, such as by depositing one or more successive metal layers on the printed circuit board 16. Accordingly, using such fabrication processes, each radiating element 18 in the phased array 10A should have a very low profile. It should be noted that embodiments of the present invention are not limited to rectangular-shaped elements 18 but instead any appropriate shape such as circular patches, ring resonator patches, or other shape patches may be used in other particular embodiments.

The phased array 10A can have one or more of any of a variety of different functional types of elements 18. For example, the phased array 10A can have transmit-only elements 18, receive-only elements 18, and/or dual mode receive and transmit elements 18 (referred to as "dual-mode elements 18"). The transmit-only elements 18 are configured to transmit outgoing signals (e.g., burst signals) only, while the receive-only elements 18 are configured to receive incoming signals only. In contrast, the dual-mode elements 18 are configured to either transmit outgoing burst signals, or receive incoming signals, depending on the mode of the phased array 10A at the time of the operation. Specifically, when using dual-mode elements 18, the phased array 10A can be in either a transmit mode, or a receive mode. The noted controller 24 at least in part controls the mode and operation of the phased array 10A, as well as other array functions.

The AESA system 10 has a plurality of the above noted integrated circuits 14 (mentioned above with regard to FIG. 5) for controlling operation of the elements 18. Those skilled in the art often refer to these integrated circuits 14 as "beam steering integrated circuits." Each integrated circuit 14 preferably is configured with at least the minimum number of functions to accomplish the desired effect. Indeed, integrated circuits 14 for dual mode (transmit and receive on same) elements 18 are expected to have some different functionality than that of the integrated circuits 14 for the transmit-only elements 18 or receive-only elements 18. Accordingly, integrated circuits 14 for such non-dual-mode elements 18 typically have a smaller footprint than the integrated circuits 14 that control the dual-mode elements 18. Despite that, some or all types of integrated circuits 14 fabricated for the phased array 10A can be modified to have a smaller footprint.

As an example, depending on its role in the phased array 10A, each integrated circuit 14 may include some or all of the following functions:
- phase shifting,
- amplitude controlling/beam weighting,
- switching between transmit mode and receive mode,
- output amplification to amplify output signals to the elements 18,
- input amplification for received RF signals (e.g., signals received from the satellite 12), and
- power combining/summing and splitting between elements 18.

Indeed, some embodiments of the integrated circuits 14 may have additional or different functionality, although illustrative embodiments are expected to operate satisfactorily with the above noted functions. Those skilled in the art can configure the integrated circuits 14 in any of a wide variety of manners to perform those functions. For example, the input amplification may be performed by a low noise amplifier, the phase shifting may use conventional active phase shifters, and the switching functionality may be implemented using conventional transistor-based switches. Additional details of the structure and functionality of integrated circuits 14 are discussed below.

In illustrative embodiments, multiple elements 18 share the integrated circuits 14, thus reducing the required total number of integrated circuits 14. This reduced number of integrated circuits 14 correspondingly reduces the cost of the AESA system 10. In addition, more surface area on the top face of the printed circuit board 16 may be dedicated to the elements 18.

To that end, each integrated circuit 14 preferably operates on at least one element 18 in the array and typically operates on a plurality of elements 18. For example, as discussed above, one integrated circuit 14 can operate on two, three, four, five, six, or more different elements 18. Of course, those skilled in the art can adjust the number of elements 18 sharing an integrated circuit 14 based upon the application. For example, a single integrated circuit 14 can control two elements 18, three elements 18, four elements 18, five elements 18, six elements 18, seven elements 18, eight elements 18, etc., or some range of elements 18. Sharing the integrated circuits 14 between multiple elements 18 in this manner reduces the required total number of integrated circuits 14, correspondingly reducing the required size of the printed circuit board 16 and cost of the system.

As noted above, and as discussed in U.S. patent application Ser. Nos. 15/267,689 and 15/267,704, which were incorporated by reference above, dual-mode elements 18 may operate in a transmit mode, or a receive mode. To that end, the integrated circuits 14 may generate time division diplex or duplex waveforms so that a single aperture or phased array 10A can be used for both transmitting and receiving. In a similar manner, some embodiments may eliminate a commonly included transmit/receive switch in the side arms (discussed below) of the integrated circuit 14. Instead, such embodiments may duplex at the element 18. This process can be performed by isolating one of the elements 18 between transmit and receive by an orthogonal feed connection. Such a feed connection may eliminate about a 0.8 dB switch loss and improve G/T (i.e., the ratio of the gain or directivity to the noise temperature) by about 1.3 dB for some implementations.

RF interconnect and/or beam forming lines 26 electrically connect the integrated circuits 14 to their respective elements 18. To further minimize the feed loss, illustrative embodiments mount the integrated circuits 14 as close to their respective elements 18 as possible. Specifically, this close proximity preferably reduces RF interconnect line lengths, reducing the feed loss. To that end, each integrated circuit 14 preferably is packaged either in a flip-chipped configuration using wafer level chip scale packaging (WLCSP) or other configuration such as extended wafer level ball-grid-array (eWLB) that supports flip chip, or a traditional package, such as quad flat no-leads package (QFN package).

It should be reiterated that although FIGS. 6 and 8 show exemplary AESA systems 10 with some specificity (e.g., specific layouts of the elements 18 and integrated circuits 14), those skilled in the art may apply illustrative embodiments to other implementations. For example, as noted above, each integrated circuit 14 can connect to more or fewer elements 18, or the lattice configuration can be different. Accordingly, discussion of the specific configurations of the AESA system 10 shown in FIGS. 6 and 8 is for convenience only and not intended to limit all embodiments.

Figure 10A:
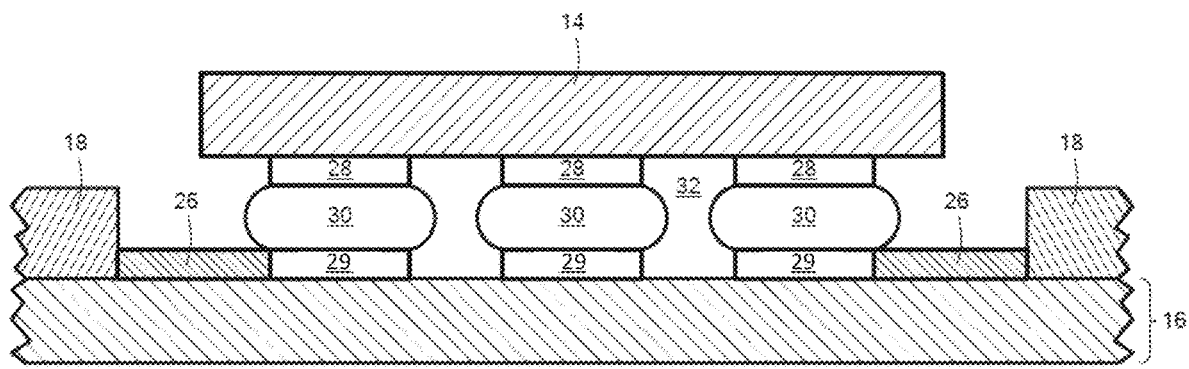
FIG. 10A schematically shows a cross-sectional view of the layout of components on the laminated printed circuit board of FIG. 8 to highlight the mounting of its integrated circuits on the same side of the PCB as the patch antenna.

FIG. 10A schematically shows a cross-sectional view of the layout of components on the laminated printed circuit board 16 of FIGS. 6 and 8 to highlight the mounting of its integrated circuits 14 with WLCSP integration on the same side of the PCB as the patch antenna. The integrated circuit 14 in this drawing intentionally is enlarged to show details of an exemplary mounting technique.

Figure 10B:
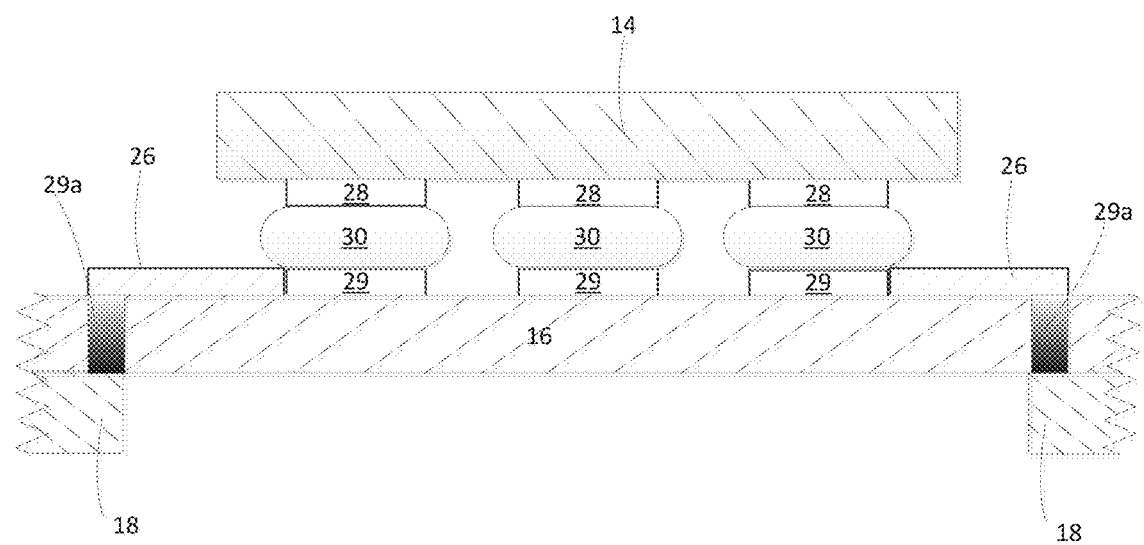
FIG. 10B schematically shows a cross-sectional view of the layout of components on the laminated printed circuit board of FIG. 8 to highlight the mounting of its integrated circuits on the opposing side of the PCB as the patch antenna.

FIG. 10B schematically shows another embodiment of the cross-sectional view of the layout of components on the laminated printed circuit board 16 of FIGS. 6 and 8 to highlight the mounting of its integrated circuits 14 with WLCSP integration on the opposing side of the PCB. The integrated circuit 14 in this drawing intentionally is enlarged to show details of an exemplary mounting technique. The connection from 26 to 18 is done through a through-PCB via (TPV) 29a. This TPV is made using standard via manufacturing process such as hardware bit drilling or laser drilling.

As shown, the integrated circuit 14 has a plurality of pads (or pins) 28 aligned with a plurality of corresponding pads 29 on the printed circuit board 16. These opposing pads 28/29 on the integrated circuit 14 and the printed circuit board 16 may be considered to form pairs of pads 28/29. Solder 30 (e.g., solder balls) electrically connects each the pads in corresponding pairs of pads 28/29. Interconnect lines, traces, and other electrical interconnects on/in the printed circuit board 16 (e.g., lines 26) thus permit the integrated circuit 14 to communicate with other elements 18 through this electrical interface.

The embodiments shown in FIGS. 10A and 10B form a space or void (identified by reference number "32") between the bottom of the integrated circuit 14 (from the perspective of this drawing) and the top surface of the printed circuit board 16. This space 32 may remain an open void—containing no material. Some embodiments may take advantage of this extra space 32 to add further components, such as additional circuit elements, without requiring more circuit board space. Alternatively, this space 32 may contain fill material (not shown) for further stability and thermal management of the integrated circuit 14. Other mounting techniques, such as surface mounting or wirebond mounting, may couple the integrated circuits 14 with the substrate 16.

Figure 11:
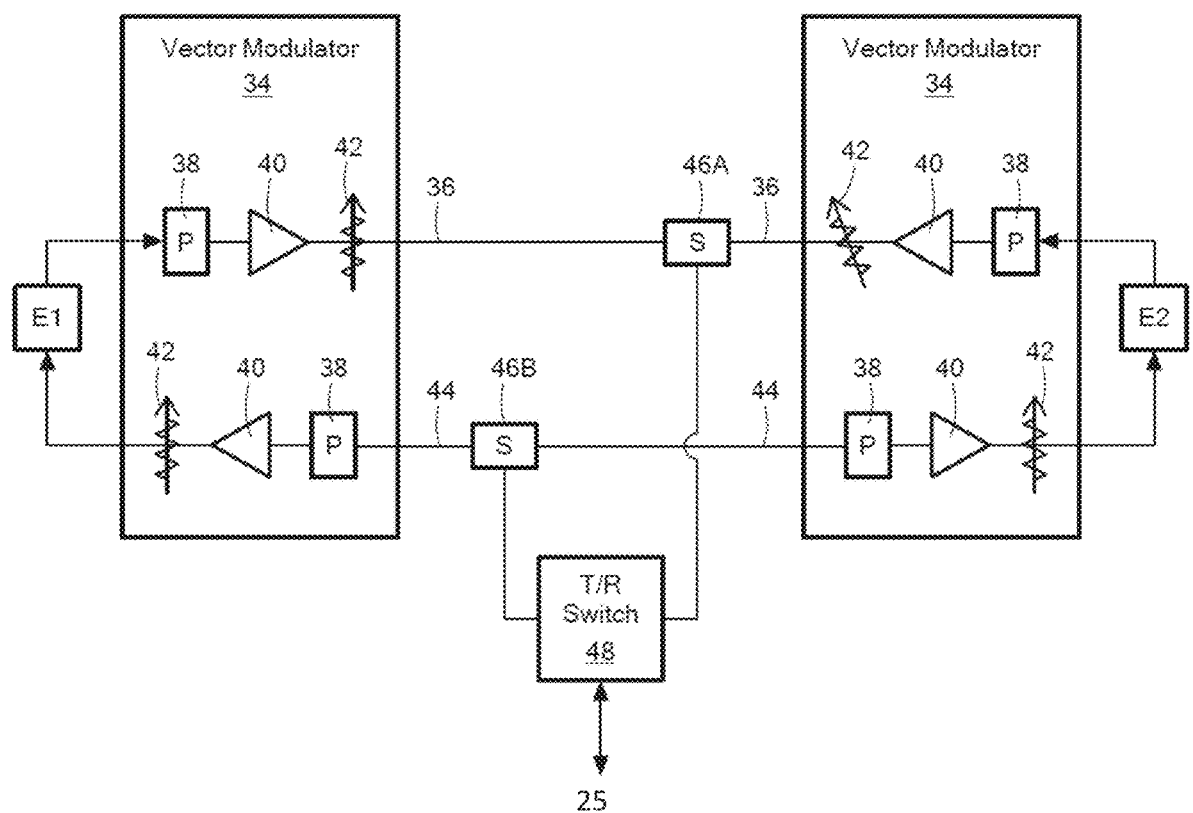
FIG. 11 schematically shows relevant portions of one integrated circuit that may be configured in accordance with illustrative embodiments of the invention to control two elements.

As noted above, each integrated circuit 14 preferably has circuitry to perform its required function. To that end, FIG. 11 schematically shows relevant portions of one integrated circuit 14 that may be configured in accordance with illustrative embodiments of the invention to control two elements 18. This exemplary integrated circuit 14 is shown and described as connected to two different elements 18 identified as element E1 and element E2. Of course, principles described with regard to FIG. 11 can apply equally to integrated circuits 14 controlling more than two elements 18, such as four elements 18.

As shown, the integrated circuit 14 has a first vector modulator 34 for controlling receipt and transmission of signals of a first element E1, and a second vector modulator 34 for controlling receipt and transmission of signals of a second element E2. The two vector modulators 34 each have a receive arm 36, coupled to their respective elements 18, for receiving signals. In FIG. 11, because they transmit signals away from their elements E1 or E2, the receive arms 36 have arrows pointing away from their respective elements E1 and E2. To that end, each receive arm 36 has a phase shift modulator 38 (also referred to as a "phase shifter 38") for changing the phase of the incoming signals, and an amplifier 40 for amplifying the incoming signal. Among other things, the amplifiers 40 in the receive arms 36 are preferably implemented as low noise amplifiers.

In illustrative embodiments, the amplifier 40 is a fixed gain amplifier. Accordingly, to control the amplification with more precision, each receive arm 36 also has an active gain controller 42 that increases or decreases the amplification provided by the amplifier 40. Alternatively, the amplifier 40 may be a variable gain amplifier. Accordingly, in that case, the active gain controller 42 may be omitted. As known by those skilled in the art, the amplifier(s) 40 and the phase shifter 38 cooperate to control incoming received signals.

In a corresponding manner, the two vector modulators 34 also each have a transmit arm 44 coupled to their respective elements 18. In an opposite manner to the receive arms 36, the transmit arms 44 in FIG. 11 have arrows pointing toward their respective elements 18. Each transmit arm 44 thus has a phase shifter 38 for changing the phase of the incoming signals, and an amplifier 40 for amplifying the incoming signal. The transmit arms 44 also may have an active gain controllers 42 if the transmit amplifiers 40 have a fixed gain. Alternatively, the transmit arms 44 may omit the active gain controllers 42 if the amplifier 40 is a variable gain amplifier. As known by those skilled in the art, the amplifier(s) 40 and the phase shifter 38 cooperate to steerably beam outgoing signals to other devices, such as to the satellite 12 of FIG. 1.

The phase shifter 38 preferably is a 4 bit phase shifter, which provides up to 16 different vectors for transmitting a beam from a given element. In illustrative embodiments, each of the 16 different vectors is substantially evenly partitioned between zero and 360 degrees (e.g., 0 degrees, 22.4 degrees, 45 degrees, etc.). Other embodiments, however, may use smaller phase shifters 38 (e.g., 3 bit phase shifters 38) or larger phase shifters 38 (e.g., 5 or 6 bit phase shifters 38). Again, this number should be coordinated with the number of elements 18, as well as the gain of the amplifiers 40. The amplifiers 40 may have active gain control from 1 dB up to 3 dB, 4 dB, 5 dB, or greater (e.g., 6 dB).

The receive arms 36 and the transmit arms 44 may be considered to be "side arms" that combine and/or distribute signals at a summation point (also referred to as a "splitter" when splitting signals). Specifically, the two receive arms 36 meet at a receiving summing node 46A that combines the received signals from both the first and second elements 18. In a corresponding manner, the two transmit arms 44 also meet at a transmitting summing node 46B that, in an opposite manner to that of the receiving summing node 46A, distributes the transmit signals of the first and second elements 18 for transmission. Among other things, the summing nodes 46 may be implemented as a compact Wilkinson power divider/summer, which, as its name suggests, distributes/divides and/or sums signals. Indeed, the summing nodes 46A and 46B may be implemented by other active components and thus, a Wilkinson power divider/summer is but one example.

In addition to connecting with the side arms, each summing node 46A also connects with a main arm (aka "common arm") that itself may have an amplifier and/or active gain controller (not shown). In illustrative embodiments, the gain of the amplifier in the main arm is greater than those in the side arms. The main arm also has a switch 48 that switches between the transmit mode to the receive mode.

Illustrative embodiments preferably do not have switches on the side arms. To that end, the transmit and receive sides of each vector modulator 34 preferably are physically coupled with adjacent sides of its element 18. Specifically, the elements 18 are sized and oriented so that, from side-to-side, they are about half the size of one anticipated wavelength of the signals being transmitted and received. In that case, the opposite sides will be about 180 degree out of phase electrically speaking in term of the RF cycle with each other. Adjacent sides, however, are orthogonal sides and provide orthogonal in polarization when compared to each other. In this manner, the transmit arms 44 may be considered to be polarized a first way, while the receive arms 36 may be considered to be polarized a second, orthogonal way. For example, the transmit arms 44 may be considered to be "vertically polarized" while the receive arms 36 may be considered to be "horizontally polarized."

Accordingly, the receive arms 36 in FIG. 11 connect with a top portion of their respective elements 18, while the transmit arms 44 of FIG. 11 connect with a side (orthogonal) portion of their respective elements 18. Those in the art recognize, however, that the receive and transmit arms 36 and 44 may be physically coupled with other adjacent sides to accomplish the same result. Indeed, other embodiments may polarize the receive and transmit arms 36 and 44 differently. As such, the specific polarization discussed above is but one example and not intended to limit various embodiments. Alternative embodiments may use other polarizations (e.g., non-orthogonal).

When coupled as shown, illustrative embodiments avoid the need for a switch on the side arms. Moreover, as noted above, using a duplexing/diplexing signal for transmit and receive further aids in this goal. For example, illustrative embodiments may use time division duplex/diplex waveforms or frequency division duplex/diplex waveforms to both transmit and receive signals. In that case, to permit asymmetric transmit and receive data transmission, the transmit and receive signals may be allocated to different time slots in the same frequency band. For example, one or more of the elements 18 may couple with a frequency diplexer (not shown) that splits its relevant signal into a first frequency signal and a second frequency signal. Each of the generated frequency signals is then routed to its own independent circuit that either receives or transmits to or from the element 18.

The duplex/diplex waveforms may be generated in a number of different ways. In some embodiments, the integrated circuits 14 are configured to produce those waveforms. In other embodiments, one or more diplexers or duplexers on the substrate 16 (not shown) at least in part produce those waveforms. Such a diplexer/duplexer may communicate with other components, such as the integrated circuits 14, using the transmission lines (e.g., traces, vias, lines, etc.) on the substrate 16.

During operation, the switch 48 in the main arm first may be set to the transmit mode. Accordingly, the main arm receives a transmit signal through the switch. Next, that signal is distributed to the two transmit arms 44 through the transmitting summing node 46B. In this capacity, the transmitting summing node 46B acts like a distribution node as it distributes the signal to be transmitted to each side arm. Next, each transmit arm 44 (in the respective vector modulators 34) then shifts and amplifies its received signal as needed, and transmits that conditioned signal through its respective element 18, e.g., to the orbiting satellite 12 shown in FIG. 1.

Figure 18:
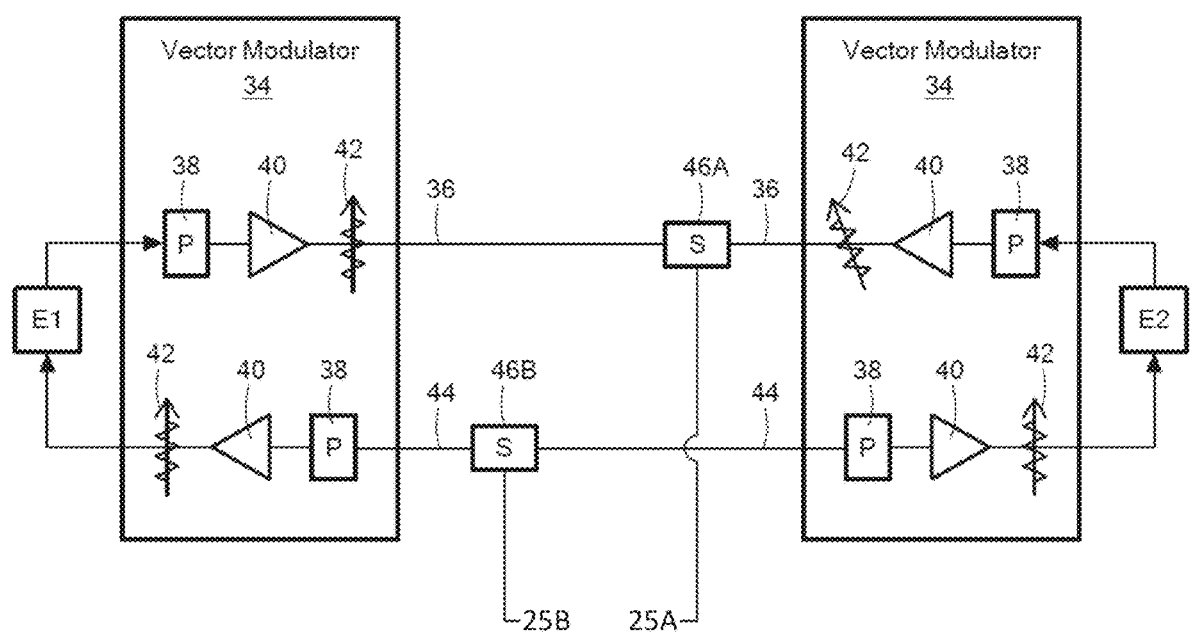
FIG. 18 schematically shows relevant portions of an alternative embodiment of the integrated circuit of FIG. 11 that may be configured in accordance with illustrative embodiments of the invention to control two elements.

After the transmission process is completed, the switch 48 on the main arm may be actuated to the receive mode. Accordingly, each receive arm 36 shifts and amplifies the signal received by its respective element E1 or E2. The receiving summing node 46A then sums or combines these two conditioned signals to produce a combined signal that is forwarded to other components through the switch 48 in the main arm. In another embodiment, the switch 48 may be omitted and instead separate transmit (25B) and receive (25A) signals may be brought onto the IC, as shown in FIG. 18. This could in allow a full duplex (simultaneous send and receive) function.

Of course, it should be noted that the specific configuration of elements in FIG. 11 is but one of a wide variety of different configurations to accomplish the desired effect. Accordingly, when implementing various embodiments, those skilled in the art can add other components, remove components, or rearrange the noted components. The specific configuration of FIG. 11 therefore is intended to be illustrative and not intended to limit various embodiments the invention. Additional details of an example of the AESA system 10 that certain embodiments may implement are shown in co-pending U.S. patent application Ser. Nos. 15/267,689 and 15/267,704, which were incorporated by reference above.

Integrated Circuit and Printed Circuit Board Layouts

One problem that can occur in AESA systems and other RF applications is that there can be interference between the signals on the integrated circuit 14 and on the substrate 16, and within the packaging. This interference can include, but is not limited to, interference from RF signals to other RF signals, interference from digital signals to RF signals (and vice versa), and interference from RF signals to digital signals and back to alternate/different RF signals including the RF COMMON port.

Figure 12:
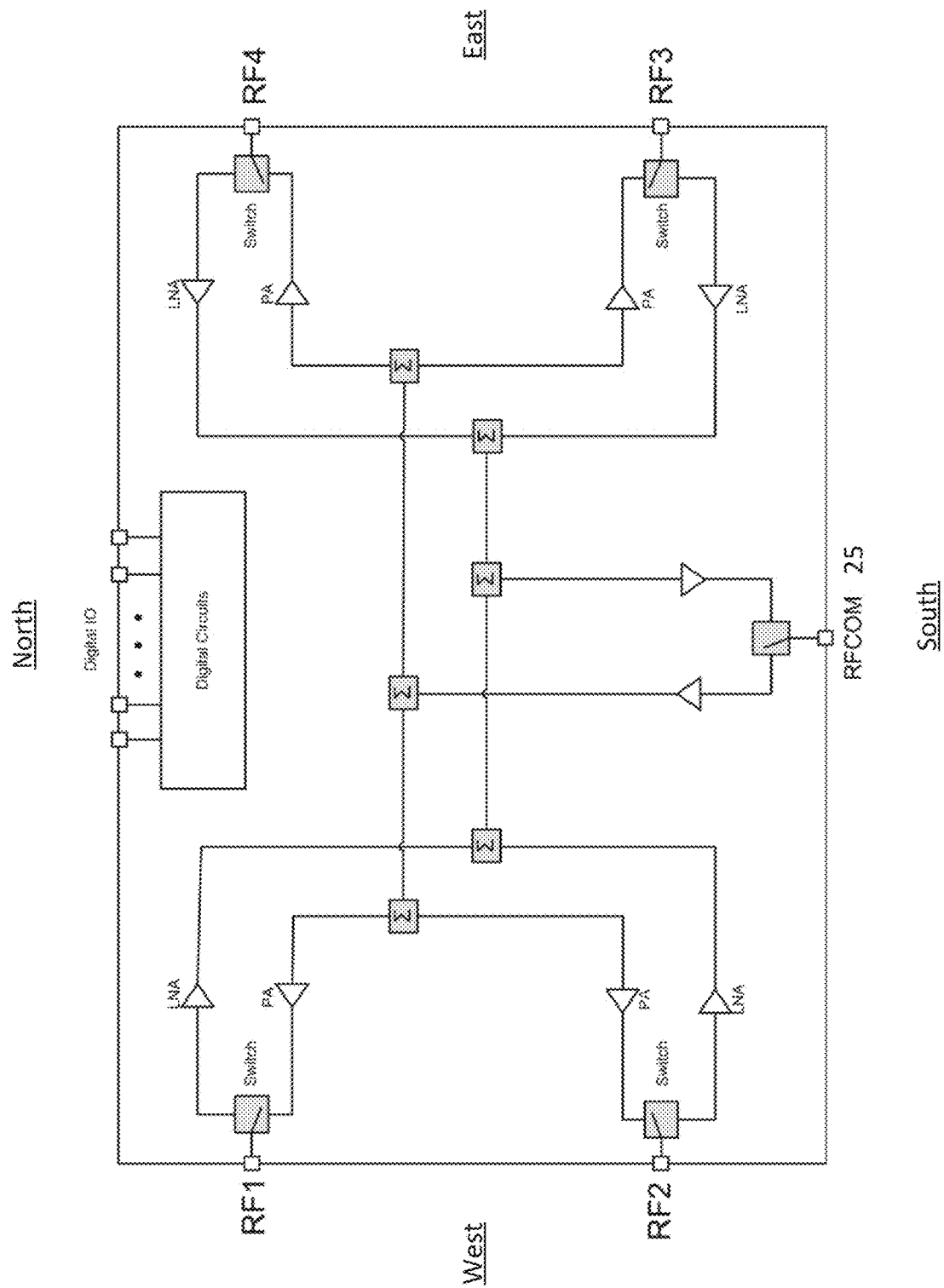
FIG. 12 is a schematic diagram showing a pin/pad layout for isolating the digital and RF signals, in accordance with one exemplary embodiment.

Therefore, in certain exemplary embodiments, the integrated circuits 14 are configured with various pins/pads (sometimes referred to herein as "leads"), with the pins/pad for the digital circuits on a first edge of the chip (referred to herein as the "North" edge), the pins/pads for the common RF signals on a second edge of the chip opposite the first edge (referred to herein as the "South" edge), and the pins/pads for the individual RF channels on third and fourth edges of the chip (referred to herein as the "East" and "West" edges), for example, as shown schematically in FIG. 12. In this exemplary embodiment, the integrated circuit 14 is configured with four RF channels (designated RF1, RF2, RF3, and RF4), e.g., to operate four elements 18. The pins/pads for the RF1 and RF2 channels are positioned on the West edge of the chip, the pins/pads for the RF3 and RF4 channels are positioned on the East edge of the chip, the pins/pads for the common RF channel (RFCOM) are positioned on the South edge of the chip, and the Digital I/O pins/pads are positioned on the North edge of the chip, e.g., for a serial to parallel interface (SPI) and for DC supply lines for the digital circuits. The East, West and South edges also may have pins/pads for DC or slow varying voltage lines. The DC or slow varying voltage lines are typically well bypassed by capacitors to ground and behave like ground lines at the high RF frequencies.

The configuration shown in FIG. 12 reduces interference between the four RF channels (RF1-RF4) and the common RF channel (RFCOM), and between the RF channels (RF1-RF4 and RFCOM) and any of the digital signals. Isolation between the RF channels (RF1-RF4) and the common RF channel (RFCOM) is particularly important in integrated circuits where the signal levels differ to any extent (e.g., when there is gain on the IC). Signal interference between the RF channels (RF1-RF4) and the common RF channel (RFCOM) generally will cause vector errors, which degrade beam forming accuracy in phased array systems.

In various alternative embodiments, RFCOM interface can be configured to distribute a common RF signal to the various other RF channels (e.g., for producing a beam-formed transmission signal by the RF channels) and/or can be configured to output a common RF signal from the various other RF channels (e.g., a beamformed signal produced by the RF channels from signals received by the corresponding elements 18). In such exemplary embodiments, each RF channel may include configurable delay and/or other circuitry for beamforming. In FIG. 12, each RF channel is shown as including a power amplifier (PA) for amplifying signals to be transmitted, a low-noise amplifier (LNA) for amplifying received signals, and a switch for selectively switching between transmit and receive modes. The transmit/receive mode and other parameters (e.g., delay, power, etc.) are typically controlled by an external controller via the digital circuits (e.g., using an SPI bus to interface with the external controller).

In certain exemplary embodiments, each RF channel (i.e., RF1, RF2, RF3, RF4 and RFCOM) includes multiple pins/pads referred to herein as an "RF group." For example, each RF group may include a center RF signal pin/pad surrounded on both sides by ground pins/pads; such an RF group would include at least three pins/pads, and the various center RF signal pins/pads would be separated by two or more ground pins/pads. Preferably, the RF groups are spaced as far apart from each other and also from the Digital I/O pins/pads as possible. Additional ground pins/pads may be placed between RF groups for additional isolation. Generally speaking, exemplary embodiments do not include any digital signals or common signals between two adjacent RF channels on a given edge of the chip. However, certain embodiments may include DC signals (e.g., labeled Vdd1-Vdd5 in FIG. 13) on the RF sides of the chip or slowly varying analog or digital lines (e.g., signals with low frequency content typically around 20 MHz or lower.

It should be noted that the integrated circuit 14 may be configured with fewer RF channels or with additional RF channels. For example, an integrated circuit 14 configured with two RF channels may have the pins/pads for one RF channel on the West side and the pins/pads for the other RF channel on the East side. Alternatively, an integrated circuit 14 configured with eight RF channels may have the pins/pads for four RF channels on the West edge and the pins/pads for the other four RF channels on the East edge or may have the pins/pads for three RF channels on the West, the pins/pads for three RF channels on the East edge, and the pins/pads for the other two RF channels on the South edge along with the pins/pads for the RFCOM channel.

Figure 13:
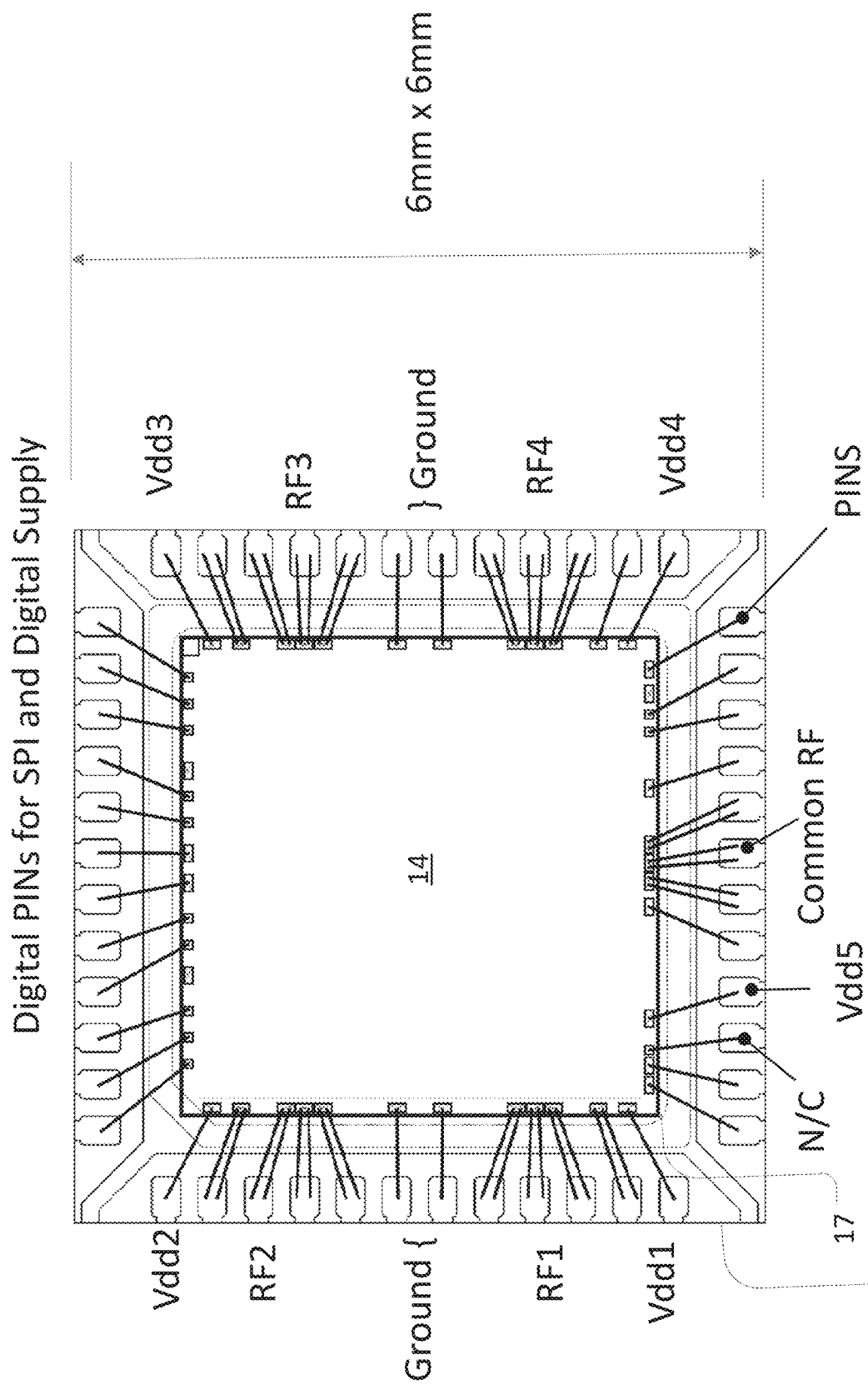
FIG. 13 is a layout/plan view showing an integrated circuit die secured within a die paddle of a leadframe base such as for a quad flat no-leads (QFN) package, in accordance with one exemplary embodiment.

FIG. 13 is a layout/plan view showing an integrated circuit 14 die secured within a die paddle 17 of a leadframe base 19 such as for a quad flat no-leads (QFN) package, in accordance with one exemplary embodiment. As discussed above, the pins/pads for the digital circuits are on the North edge of the die 14. The DC supply pins used to supply the RF channels are designated Vdd1-Vdd5. The die 14 is preferably fabricated using SiGe—BiCMOS or plain silicon technology with through-silicon vias (TSVs) to the bottom side of the die 14 facing the die paddle 17, for example, as discussed in U.S. Pat. No. 9,455,157, which is hereby incorporated herein by reference in its entirety. In this example, the package size is 6 mm×6 mm, although various alternative embodiments can use different package sizes, e.g., ranging from around 5 mm to 7 mm. It should be noted that the size of the package is critical for contemplated embodiments having a large number of elements 18 and corresponding integrated circuits 14 on a printed circuit board 16 in a high-density configuration, and the pin/pad layout of the integrated circuit 14 allows for the digital and RF circuitry to be laid-out on the chip in an efficient manner as depicted schematically in FIG. 12, thus allowing for package sizes ranging from around 5 mm to 7 mm or even smaller. Preferably, the die 14 is as close to the size of the paddle 17 as possible (and even exactly the size of the leadframe paddle within an acceptable tolerance) in order to minimize the length of electrical connections between the die 14 and the package leads. Shortening the length of the electrical connections also increases RF isolation, so the pin/pad layout, electrical connection lengths, and package size all contributed to increased signal isolation. It should be noted that the integrated circuit 14 die could be in a wafer level chip scale package (WLCSP) rather than in a QFN package and could be flip-chip attached.

Figure 14:
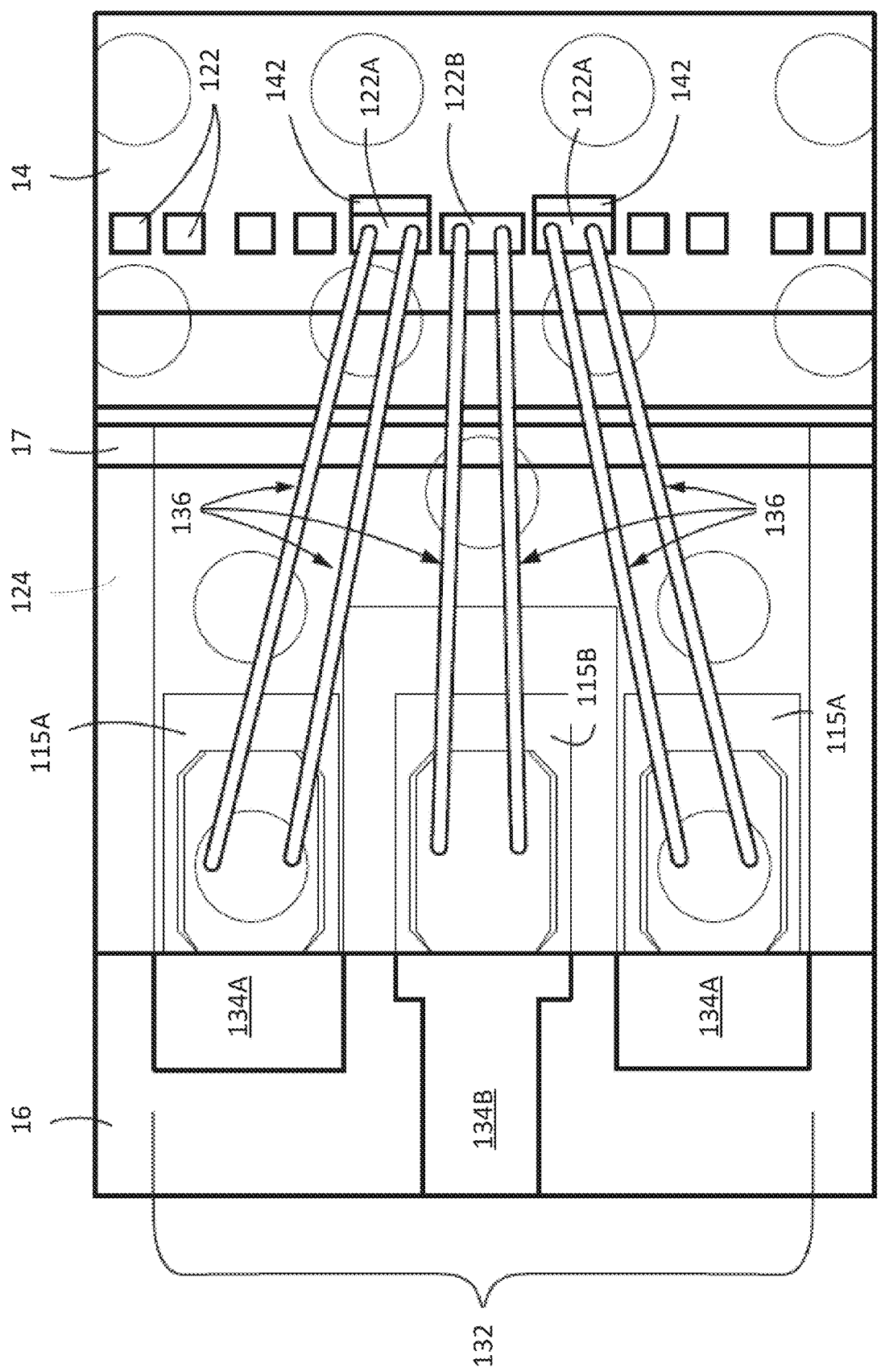
FIG. 14 is a schematic diagram showing an enlarged plan view of an RF group of FIG. 13, in accordance with one exemplary embodiment.

FIG. 14 is a schematic diagram showing an enlarged plan view of an RF group of FIG. 13, in accordance with one exemplary embodiment. As shown, the die 14 has a plurality of pads (shown schematically and generally identified by reference number 122) that enable it to communicate with other devices through leads 115 of the package. In this example, the package preferably is a leadframe package having a copper leadframe 124 and encapsulant material (not shown so as to better shown the various components). Those skilled in the art should understand that the encapsulant often is opaque, such as a solid black. The leadframe 124, whether it is part of a post-molded or a premolded leadframe package, may be considered to form a base upon which the die 14 is mounted.

The leadframe 124 has a relatively flat aggregate shape with a plurality of leads 115 along its periphery. In this embodiment, the leads 115 are generally flush with a bottom side of the package and thus, do not extend from the package. As such, this package may be surface mounted to the printed circuit board 16. Other embodiments, however, may have leads 115 extending from the package and thus, may be connected to the printed circuit board 16 using other techniques, such as conventional through-hole mounting technology. The leadframe 124 also has a large centrally located portion known in the art as a "die paddle" (reference numeral 17). In illustrative embodiments, the die paddle 17 preferably has a ground potential during use.

The leads 115 of the package preferably form a plurality of "RF groups 132" for managing RF signal transmission to and from the die 14 and the printed circuit board 16. In a similar manner, both the printed circuit board 16 and the die 14 also may be considered to respectively form corresponding RF groups 132 of pads 122 and conductive transmission lines 134. FIG. 14 shows details of one RF group 132; other RF groups generally would have the same or a similar configuration. Illustrative embodiments mitigate or reduce the RF parasitic coupling between the different RF groups 132.

Specifically, as shown, the RF group 132 has a central RF signal lead 115B for electrically connecting an RF signal pad 122B on the die 14 with a corresponding signal line 134B of the printed circuit board 16. In addition to having the central RF signal lead 115B, the RF group 132 also preferably has a ground lead 115A on each side of the central RF signal lead 115B for electrically connecting a corresponding ground pad 122A on the die 14 with a corresponding ground line 134A of the printed circuit board 16. The ground leads 115A preferably are grounded during use.

In the embodiment shown, for a given RF group 132, a pair of wirebonds 136 electrically connects the RF signal pad 122B on the die 14 with the single signal lead 115B on the leadframe 124. Similarly, a pair of wirebonds 136 electrically connects each ground pad 122A on the die 14 with a corresponding ground lead 115A on the leadframe 124. The leads 115 may be surface mounted to the lines 134 on the printed circuit board 16.

Flanking the central RF electrically connection with ground connections in this manner is believed to improve performance. The use of two wirebonds 136 per electrical connection in this manner is believed to further improve performance. Some embodiments, however, may use more than two wirebonds 136 to make this connection. Other embodiments may use only one wirebond 136. Those skilled in the art can select an appropriate wirebond number and configuration based on the performance desired.

In addition to the wirebond(s) 136, each ground pad 122A also may be directly connected to the die paddle 17 through a shorter wirebond (not shown). In this way, each ground pad 122A of the RF group 132 would electrically connect with both the die paddle 17 and a corresponding ground lead 115A, and both the die paddle 17 and the ground lead 115A generally would be grounded during use.

Additionally, or alternatively, each ground pad 122A may be directly connected to the die paddle 17 by means of one or more die vias extending through the die 14 (not shown). For example, the die 14 may have a plurality of die vias electrically connecting each ground pad 122A of an RF group 132 to metallization on the bottom of the die 14, referred as wide ground plane. In some embodiments, the die via itself forms the metallization on the bottom of the die 14. This metallization layer on the bottom of the die 14 connects directly to the die paddle 17, making the requisite electrical connection.

Figure 17:
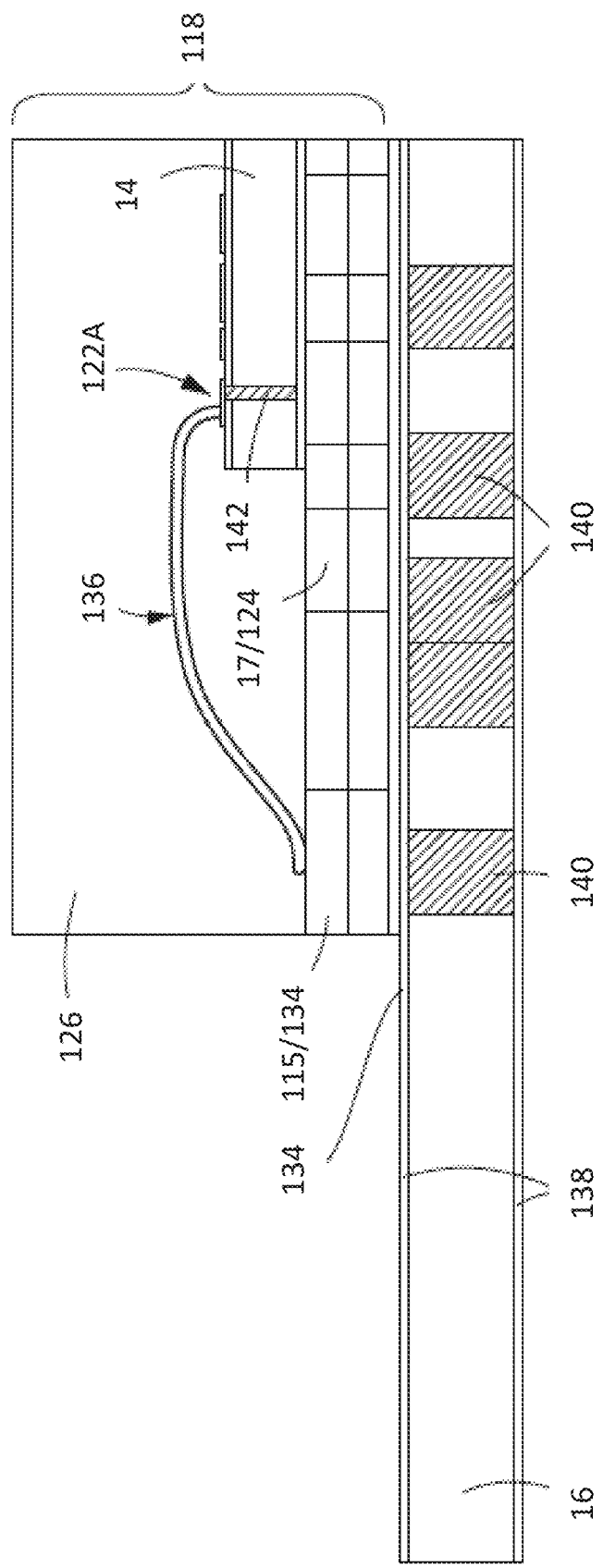
FIG. 17 schematically shows a cross-sectional view of the packaged integrated circuit of FIG. 14 including die vias, in accordance with one exemplary embodiment.

FIG. 17 schematically shows a cross-sectional view of the packaged integrated circuit 14 of FIG. 14 including die vias, in accordance with one exemplary embodiment. As discussed herein, the integrated circuit 14 and leadframe 124 are encapsulated with an encapsulant 126 to form a packaged integrated circuit 118 that is coupled (e.g., surface mounted) to the printed circuit board 16. The integrated circuit 14 includes a conductive die via 142 from a ground pad 122A to the bottom of the integrated circuit 14 for making electrical contact with the die paddle 17, which typically is grounded when in use, e.g., through a connection to a part of the conductive top layer of the RF board (e.g., transmission line metal 134) or through via 140 to the ground plane (e.g., metal layer 138) of the printed circuit board 16. In this example, the printed circuit board 16 includes various printed circuit board vias 140 for making electrical connections from the top of the printed circuit board 16 to the metal layer 138.

It should be noted that in the described embodiments, the footprint of the die 14 can be very close to the size of the die paddle 17, particularly when no electrical connections are made from the ground pads 122A to the die paddle 17. Accordingly, such embodiments favorably mitigate parasitic RF coupling while reducing the size requirements of the package and printed circuit board 16.

Figure 15:
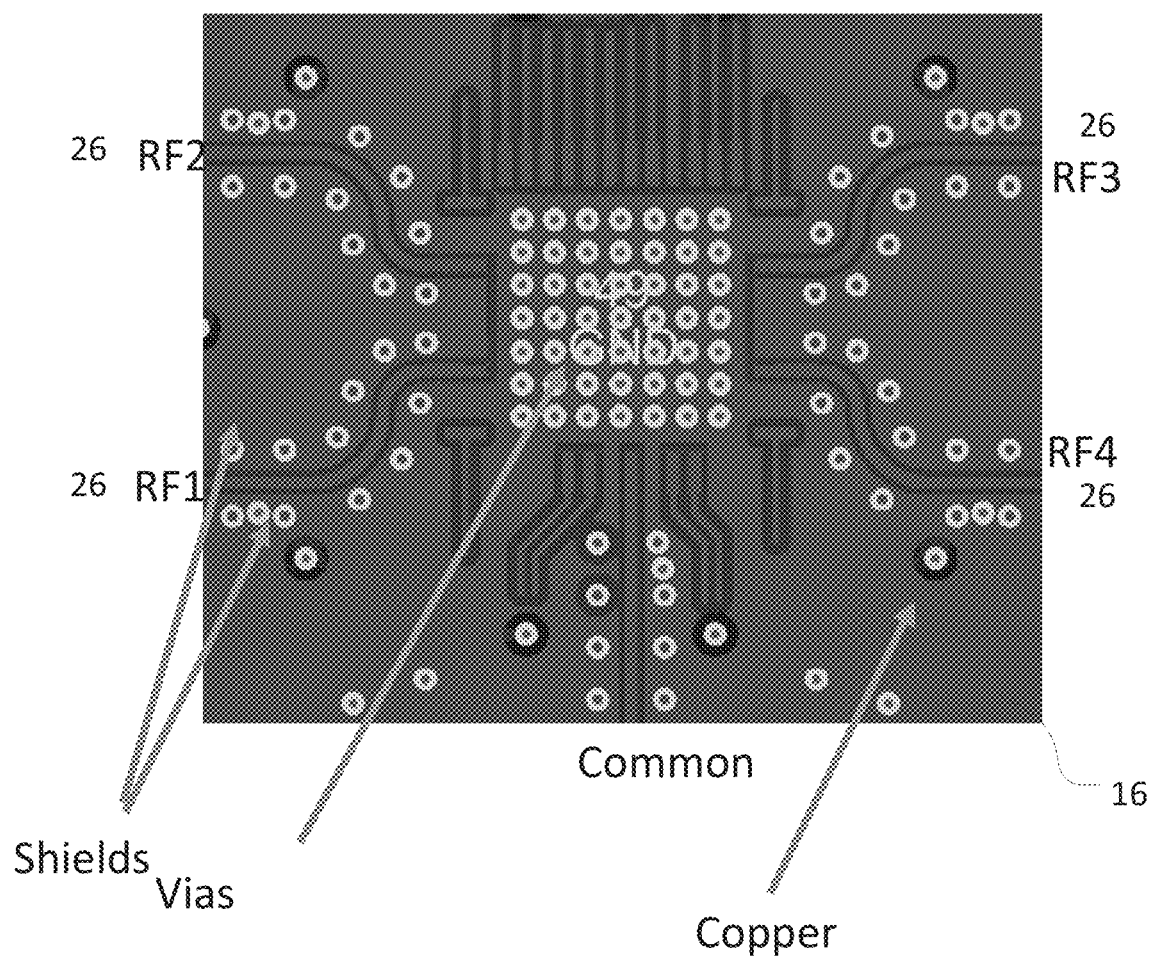
FIG. 15 is a layout/plan view of a top layer and solder mask of a printed circuit board upon which a QFN package could be mounted, such as for use with the packaged integrated circuit of FIG. 13, in accordance with one exemplary embodiment.
Figure 16:
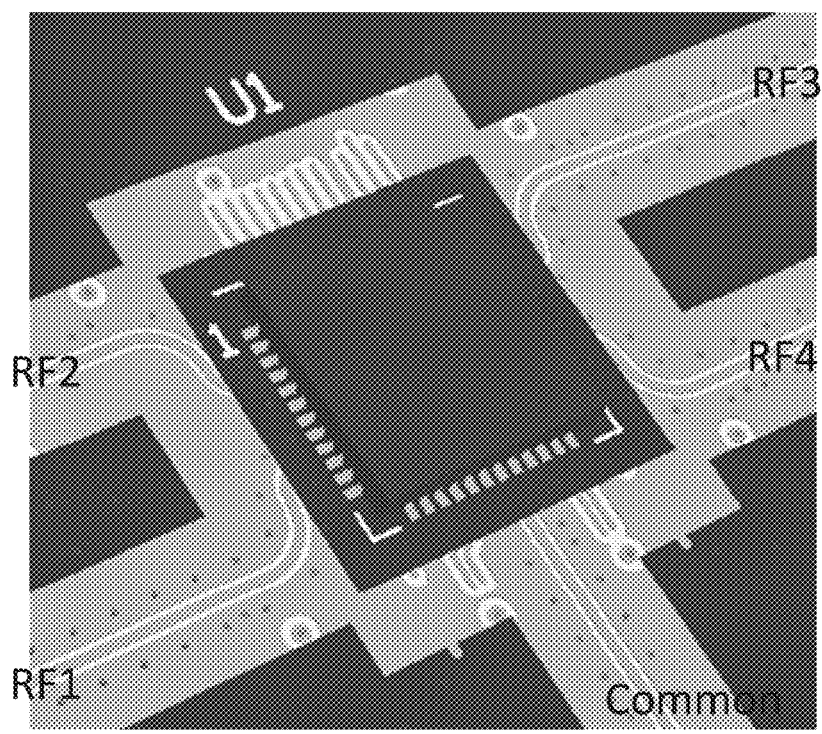
FIG. 16 shows a perspective view of a chip mounted on the printed circuit board of FIG. 15.

FIG. 15 is a layout/plan view of a top layer and solder mask of a printed circuit board upon which a packaged integrated circuit (e.g., a QFN package of the type discussed with reference to FIG. 13, or a WLCSP or eWLB package) could be mounted, in accordance with one exemplary embodiment. FIG. 16 shows a perspective view of a chip mounted on the printed circuit board of FIG. 15. In this example, the black color in FIG. 15 represents the top metal that in FIG. 16 is shown in a yellow (copper) shade. FIG. 15 therefore more clearly shows the metal connections. The via pattern in the center shows the ground connections from the bottom side of the printed circuit board 16 to the package IC 14 thereby forming a wide ground plane for reference. The RF lines 26 for making connections to the elements 18 are routed away from one another and are surrounded by metal forming shields in order to increase isolation between the RF signals on the substrate 16. The RF lines 26 connect to the package pins/pads and are connected to the RF pins/pads of the package. This arrangement is expected to provide excellent isolation, e.g., in excess of 50 dB. The innovative arrangement of SPI pins/pads and DC pins/pads result in reduced coupling. Keeping digital and DC pins separate from RF pins helps to improve isolation from RF signals to other pins. As mentioned earlier, RF signals can interfere with digital signals and couple back to other/alternative RF signals. The DC pins on the other hand can be managed through bypassing on chip and on board. In addition, since the DC pins contact large supply planes in the substrate 16, they provide a substantial lower coupling path. As a result, they can be closer to the RF lines as in the south side or bottom of the package.

Although the above discussion discloses various exemplary embodiments of the invention, it should be apparent that those skilled in the art can make various modifications that will achieve some of the advantages of the invention without departing from the true scope of the invention.

What is claimed is:

1. An active electronically steered antenna integrated circuit comprising:
    a top;
    a bottom;
    four edges including distinct first, second, third, and fourth edges, wherein the second edge is opposite the first edge;
    a set of digital circuitry pads on the first edge, the set of digital circuitry pads associated with digital circuitry of the integrated circuit;
    a set of common RF pads on the second edge opposite the first edge, the set of common RF pads associated with common RF circuitry of the integrated circuit; and
    at least one set of channel RF pads on each of the third and fourth edges, each set of channel RF pads associated with distinct RF channel circuitry of the integrated circuit for at least one antenna element, wherein the set of common RF pads are configured for at least one of (a) providing a common RF signal to the RF channels or (b) receiving a combined RF signal from the RF channels, and wherein the sets of RF pads are physically and electronically isolated from the digital circuitry pads and digital circuitry and from the other RF channels and other RF channel circuitry.

2. An integrated circuit according to claim 1, wherein the at least one set of channel RF pads on each of the third and fourth edges comprises at least two sets of channel RF pads on each of the third and fourth edges.

3. An integrated circuit according to claim 1, wherein the set of common RF pads and each set of channel RF pads comprises:
    a central RF pad; and
    a pair of ground pads positioned on opposing sides of the central RF pad.

4. An integrated circuit according to claim 2, further comprising:
    at least one ground pad between two sets of channel RF pads on each of the third and fourth edges.

5. An integrated circuit according to claim 3, further comprising:
    a ground connection providing an electrical connection from a ground plane to at least one ground pad of an RF group.

6. An integrated circuit according to claim 1, wherein the integrated circuit comprises SiGe BiCMOS components.

7. An integrated circuit according to claim 1, wherein each RF channel is configured with both transmit and receive circuitry.

8. An integrated circuit according to claim 1, wherein the integrated circuit is a flip-chip integrated circuit.

9. An integrated circuit according to claim 8, packaged in a wafer level chip scale package (WLCSP).

10. An integrated circuit according to claim 8, packaged in an extended wafer level ball-grid-array (eWLB).

11. An integrated circuit according to claim 1, further comprising:
    a leadframe including a set of digital circuitry leads corresponding to the set of digital circuitry pads, a set of common RF leads corresponding to the set of common RF pads, a set of channel RF leads corresponding to each set of channel RF pads, and electrical conductors connecting each of said pads of the integrated circuit with a corresponding lead of the leadframe.

12. A integrated circuit according to claim 11, wherein the at least one set of channel RF pads on each of the third and fourth edges comprises at least two sets of channel RF pads on each of the third and fourth edges.

13. A integrated circuit according to claim 11, wherein the set of common RF pads and each set of channel RF pads comprises:
    a central RF pad; and
    a pair of ground pads positioned on opposing sides of the central RF pad.

14. A integrated circuit according to claim 12, further comprising:
    at least one ground pad between two sets of channel RF pads on each of the third and fourth edges.

15. A integrated circuit according to claim 13, wherein the leadframe includes a die paddle representing a ground plane, and wherein the integrated circuit includes a ground via providing an electrical connection from the bottom of the integrated circuit between at least one ground pad of an RF group and the die paddle.

16. A integrated circuit according to claim 11, wherein at least one pad of the integrated circuit is connected to a corresponding lead of the leadframe using two or more electrical conductors.

17. A integrated circuit according to claim 11, wherein the leadframe is between about 5 mm to 7 mm square.

18. A integrated circuit according to claim 11, wherein each RF channel is configured with both transmit and receive circuitry.

19. A method of forming a packaged integrated circuit, the method comprising:
    providing an integrated circuit according to claim 1;
    providing a leadframe including a set of digital circuitry leads corresponding to the set of digital circuitry pads, a set of common RF leads corresponding to the set of common RF pads, a set of channel RF leads corresponding to each set of channel RF pads;
    electrically connecting each of said pads of the integrated circuit with a corresponding lead of the leadframe; and
    encapsulating the integrated circuit and at least part of the leadframe.

20. The method as defined by claim 19, wherein the leadframe includes a die paddle, and wherein the method further comprises securing the integrated circuit to the die paddle.

21. The method as defined by claim 19, wherein the integrated circuit comprises a via extending from the bottom, and wherein securing the integrated circuit to the die paddle comprises electrically connecting the via with the die paddle.

22. The method as defined by claim 19, wherein electrically connecting each of said pads of the integrated circuit with a corresponding lead of the leadframe comprises connecting at least one wirebond between each of said pads of the integrated circuit and the corresponding lead of the leadframe.

23. An active electronically steered antenna system comprising:
    a circuit board;
    a plurality of patch antennas on the circuit board;

a plurality of packaged integrated circuits on the circuit board, each packaged integrated circuit including:
an integrated circuit according to claim 1; and
a leadframe including a set of digital circuitry leads corresponding to the set of digital circuitry pads, a set of common RF leads corresponding to the set of common RF pads, a set of channel RF leads corresponding to each set of channel RF pads, and electrical conductors connecting each of said pads of the integrated circuit with a corresponding lead of the leadframe;
wherein each patch antenna is electrically connected to a distinct RF channel of a packaged integrated circuit.

24. An active electronically steered antenna system according to claim 23, wherein the at least one set of channel RF pads on each of the third and fourth edges comprises at least two sets of channel RF pads on each of the third and fourth edges.

25. An active electronically steered antenna system according to claim 23, wherein the set of common RF pads and each set of channel RF pads comprises:
a central RF pad; and
a pair of ground pads positioned on opposing sides of the central RF pad.

26. An active electronically steered antenna system according to claim 24, further comprising:
at least one ground pad between two sets of channel RF pads on each of the third and fourth edges.

27. An active electronically steered antenna system according to claim 25, wherein the leadframe includes a die paddle representing a ground plane, and wherein the integrated circuit includes a ground via providing an electrical connection from the bottom of the integrated circuit between at least one ground pad of an RF group and the die paddle.

28. An active electronically steered antenna system according to claim 23, wherein at least one pad of the integrated circuit is connected to a corresponding lead of the leadframe using two or more electrical conductors.

29. An active electronically steered antenna system according to claim 23, wherein each packaged integrated circuit is between about 5 mm to 7 mm square.

30. An active electronically steered antenna system according to claim 23, wherein each RF channel is configured with both transmit and receive circuitry.

31. An active electronically steered antenna system according to claim 23, wherein the integrated circuits are on a same side of the printed circuit board as the patch antennas.

32. An active electronically steered antenna system according to claim 23, wherein the integrated circuits are on a different side of the printed circuit board than the patch antennas, and wherein the printed circuit board includes conductive vias configured to make electrical connections between the integrated circuits and the patch antennas.

33. An active electronically steered antenna system according to claim 32, wherein the electrical connections include impedance controlled lines and transitions.

* * * * *

UNITED STATES PATENT AND TRADEMARK OFFICE
CERTIFICATE OF CORRECTION

PATENT NO. : 10,826,195 B2
APPLICATION NO. : 15/938647
DATED : November 3, 2020
INVENTOR(S) : Kristian N. Madsen et al.

Page 1 of 1

It is certified that error appears in the above-identified patent and that said Letters Patent is hereby corrected as shown below:

In the Claims

At Column 18, Claim number 12, Line number 7, please replace "A integrated" with -- An integrated --

At Column 18, Claim number 13, Line number 11, please replace "A integrated" with -- An integrated --

At Column 18, Claim number 14, Line number 17, please replace "A integrated" with -- An integrated --

At Column 18, Claim number 15, Line number 21, please replace "A integrated" with -- An integrated --

At Column 18, Claim number 16, Line number 27, please replace "A integrated" with -- An integrated --

At Column 18, Claim number 17, Line number 31, please replace "A integrated" with -- An integrated --

At Column 18, Claim number 18, Line number 33, please replace "A integrated" with -- An integrated --

Signed and Sealed this
Nineteenth Day of January, 2021

Andrei Iancu
*Director of the United States Patent and Trademark Office*